(12) United States Patent
Danial et al.

(10) Patent No.: US 11,720,785 B2
(45) Date of Patent: Aug. 8, 2023

(54) ANALOG TO DIGITAL CONVERTER USING MEMRISTORS IN A NEURAL NETWORK

(71) Applicant: Technion Research & Development Foundation Limited, Haifa (IL)

(72) Inventors: Loai Danial, Nazareth (IL); Shahar Kvatinsky, Hanaton (IL)

(73) Assignee: Technion Research & Development Foundation Limited, Haifa (IL)

( * ) Notice: Subject to any disclaimer, the term of this patent is extended or adjusted under 35 U.S.C. 154(b) by 465 days.

(21) Appl. No.: 15/931,690

(22) Filed: May 14, 2020

(65) Prior Publication Data

US 2020/0272893 A1   Aug. 27, 2020

Related U.S. Application Data

(63) Continuation of application No. PCT/IL2018/051230, filed on Nov. 14, 2018.

(60) Provisional application No. 62/585,578, filed on Nov. 14, 2017.

(51) Int. Cl.

| | |
|---|---|
| *G06N 3/063* | (2006.01) |
| *G06N 3/08* | (2006.01) |
| *G11C 11/54* | (2006.01) |
| *G06N 3/02* | (2006.01) |
| *G06N 3/04* | (2023.01) |

(52) U.S. Cl.
CPC ............ *G06N 3/0635* (2013.01); *G06N 3/02* (2013.01); *G06N 3/04* (2013.01); *G06N 3/08* (2013.01); *G11C 11/54* (2013.01); *G05B 2219/34007* (2013.01)

(58) Field of Classification Search
CPC ............ G06N 3/049; G06N 3/02; G06N 3/08; G06N 20/00; G06N 3/088; G06N 5/022
See application file for complete search history.

(56) References Cited

U.S. PATENT DOCUMENTS

| 5,115,492 A   * | 5/1992 | Engeler ................ G06N 3/0481 |
| | | 708/3 |
| 6,198,421 B1 | 3/2001 | Doyle et al. |
| 2013/0132314 A1 | 5/2013 | Snider |
| 2017/0083813 A1* | 3/2017 | Augustine ............. G06N 3/063 |
| 2017/0098156 A1 | 4/2017 | Nino et al. |

(Continued)

FOREIGN PATENT DOCUMENTS

| WO | WO 2019/012533 | 1/2019 |
| WO | WO 2019/097513 | 5/2019 |

OTHER PUBLICATIONS

International Preliminary Report on Patentability dated May 28, 2020 From the International Bureau of WIPO Re. Application No. PCT/IL2018/051230. (7 Pages).

(Continued)

*Primary Examiner* — Todd Buttram

(57) ABSTRACT

An analog to digital converter comprises an input for receiving an analog input signal; a plurality of outputs for outputting parallel bits of a digital signal that represents said analog input signal; and a neural network layer providing connections between each of said outputs respectively, each connection having an adjustable weighting. The synapses of the neural networks may be memristors and training may use online gradient descent.

16 Claims, 11 Drawing Sheets
(8 of 11 Drawing Sheet(s) Filed in Color)

(56) References Cited

U.S. PATENT DOCUMENTS

2020/0272893 A1* 8/2020 Danial ................ G06N 3/0635

OTHER PUBLICATIONS

International Search Report and the Written Opinion dated Dec. 31, 2018 From the International Searching Authority Re. Application No. PCT/IL2018/051230. (12 Pages).

Danial et al. "Breaking Through the Speed-Power-Accuracy Tradeoff in ADCs Using a Memristive Neuromorphic Architecture", IEEE Transactions on Emeerging Topics in Computational Intelligence, 2(5): 396-409, Published Online Sep. 20, 2018.

Mahmoodi et al. "An Ultra-Low Energy' Internally Analog, Externally Digital Vector-Matrix Multiplier Based on NOR Flash Memory Technology", Proceedings of the 55th Annual Design Automation Conference, DAC '18, San Francisco, CA, USA Jun. 24-29, 2018, 6 P., Jun. 24, 2018.

* cited by examiner

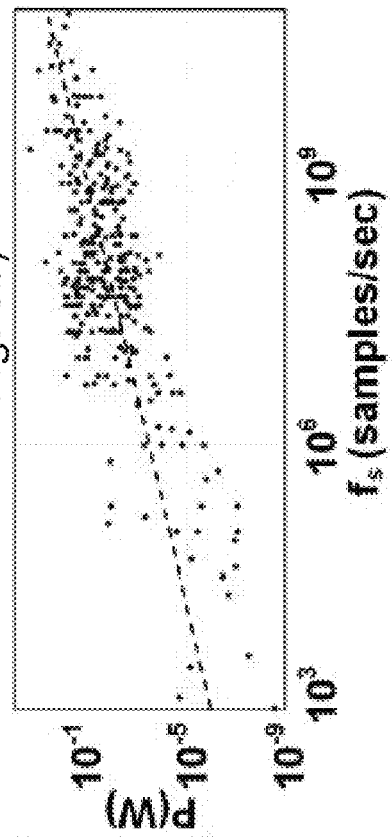
Fig. 3a)
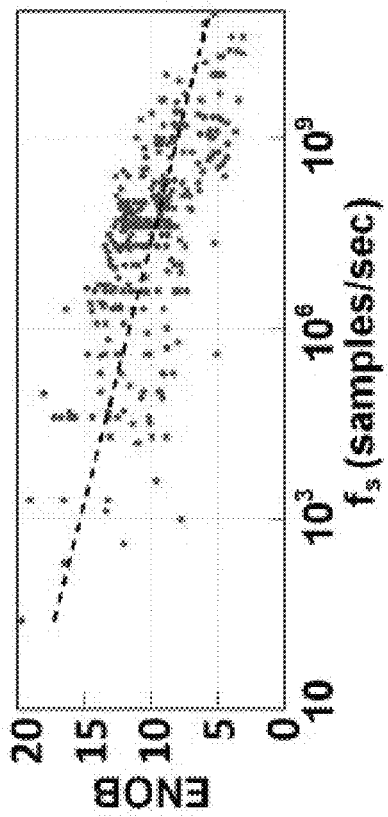
Fig. 3b)
Fig. 3c)
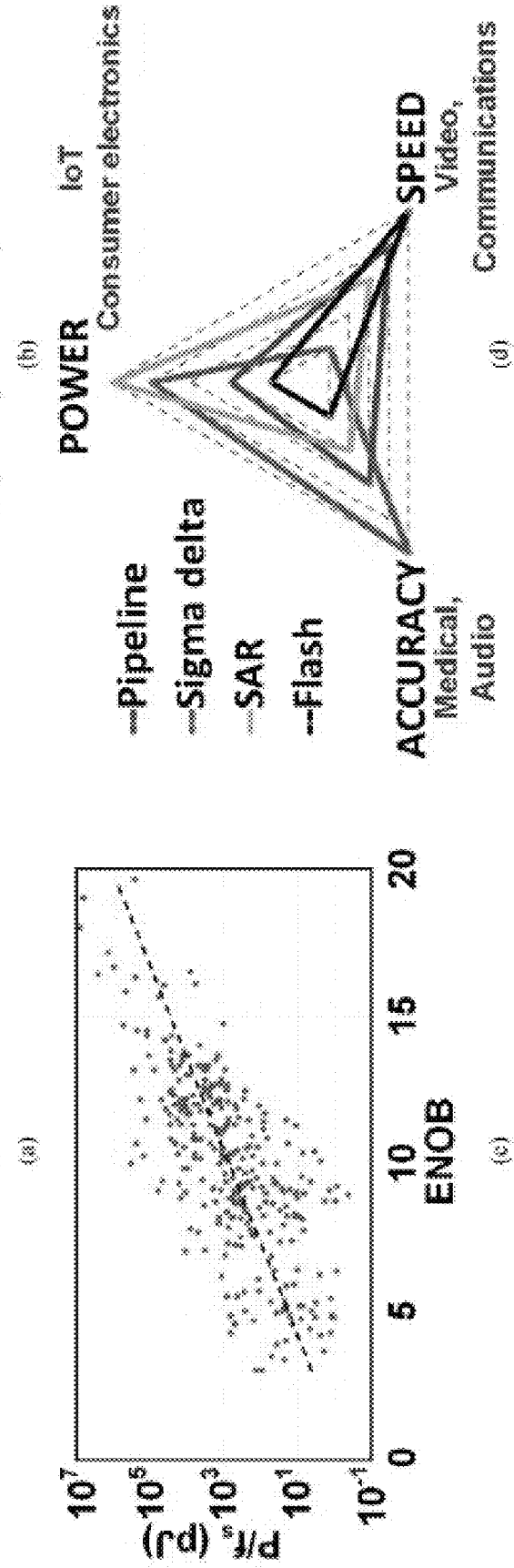
Fig. 3d)

ANALOG TO DIGITAL CONVERTER USING MEMRISTORS IN A NEURAL NETWORK

RELATED APPLICATIONS

This application is a US Continuation of PCT Patent Application No. PCT/IL2018/051230 having international filing date of Nov. 14, 2018 which claims the benefit of priority under 35 USC § 119(e) of U.S. Provisional Patent Application No. 62/585,578 filed on Nov. 14, 2017. The contents of the above applications are all incorporated by reference as if fully set forth herein in their entirety.

FIELD AND BACKGROUND OF THE INVENTION

The present invention, in some embodiments thereof, relates to an analog to digital converter (ADC) using memristors in a neural network.

The rapid evolution of data-driven systems towards the internet of things era has paved the way to emergent interacting and varying applications where data converters are ubiquitous. With the advent of high-speed, high-precision, and lowpower mixed-signal systems, there is an ever-growing demand for accurate, fast, and energy-efficient data converters. These systems operate on a broad range of real-world continuous time signals; examples include medical imaging, biosensors, wearable devices, consumer electronics, automotive, instrumentation, and telecommunication. Unfortunately, the intrinsic speed-power-accuracy tradeoff in analog-to-digital converters (ADCs) is pushing them out of the application band of interest. Furthermore, with the nonstop downscaling of technology motivated by Moore's law, this tradeoff has become a chronic bottleneck of modern systems design due to alarming deep sub-micron effects. Those effects are poorly handled with particular design techniques that overload data converters with tremendous overhead, exacerbating the tradeoff and degrading their performance dramatically. Nowadays data converters lack design standards and are customized with sophisticated specific design flow and architectures for special purpose applications.

SUMMARY OF THE INVENTION

The present embodiments comprise constructing an analog to digital converter that samples an input and uses a neural network based on memristor components to train for particular signals. Output bits as well as the current input are used as the input to the neural network to produce the new output bits.

According to an aspect of some embodiments of the present invention there is provided an analog to digital converter comprising:

an input for receiving an analog input signal;

a plurality of outputs for outputting parallel bits of a digital signal that represents the analog input signal; and a trainable neural network layer, the neural network layer comprising connections between each of the outputs respectively, each connection having a weighting, the weighting being adjustable for training.

In an embodiment, the connections comprise adaptable synapses respectively to provide the adjustable weightings.

In an embodiment, each adaptable synapse is set with a respective weighting and each output bit is a comparison result from a weighted sum of the plurality of output bits.

In an embodiment, each of the adaptable synapses comprises a memristor, the memristor being set with the respective weight.

Embodiments may further comprise a training unit which has a training dataset input and may be connected to the output bits, to adjust each of the adaptable synapses until outputs of a given input correspond to a training dataset.

In an embodiment, the training dataset is used in combination with a predetermined maximum voltage and a predetermined number of output bits.

Embodiments may carry out the adjusting by using online gradient descent. The online gradient descent may comprise iterations k of:

$$W^{(k+1)} = W^{(k)} - \frac{\eta}{2} \nabla_{W^{(k)}} \sum_{i=0}^{N-1} (D_i^{(k)} - T_i^{(k)})^2$$

wherein η is a learning rate and $Vi^{(k)}$ is a single empirical sample provided to the input at the $k^{th}$ iteration, and:

$$\Delta W_{ij(j>i)}^{(k)} = -\eta(T_i^{(k)} - D_i^{(k)})T_j^{(k)3}.$$

In an embodiment, the adjusting comprises minimizing a training error function and an energy cost function.

In an embodiment, adjusting comprises minimizing a figure of merit, the figure of merit being:

$$\frac{P}{2^{ENOB} \cdot f_S} \left[ \frac{J}{conv} \right]$$

wherein P is a power dissipation during conversion, fs is a sampling frequency and:

$$ENOB = \frac{SNDR(\text{dB}) - 1.76}{6.02}$$

wherein SNDR is a signal and noise to distortion ratio.

According to a second aspect of the present invention there is provided an analog to digital conversion method comprising:

receiving an analog input signal;

outputting parallel bits of a digital signal that represents the analog input signal at outputs;

providing connections between each of the outputs respectively; and providing an adjustable weighting to each connection, thereby to provide a trainable neural network connecting the outputs.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 4:
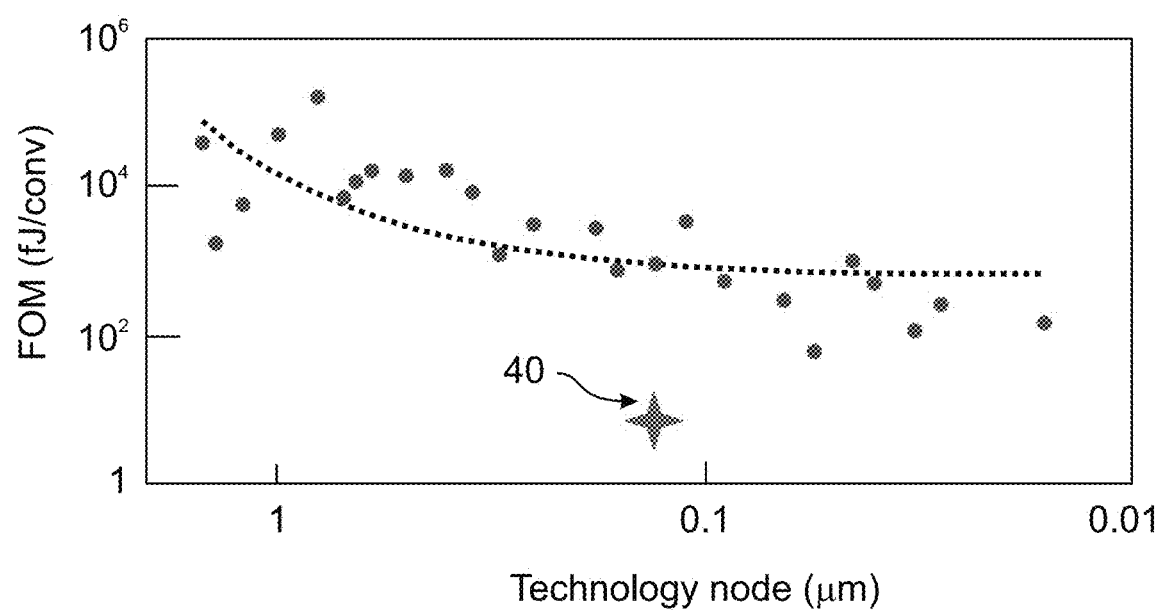
Figures 5A, 5B:
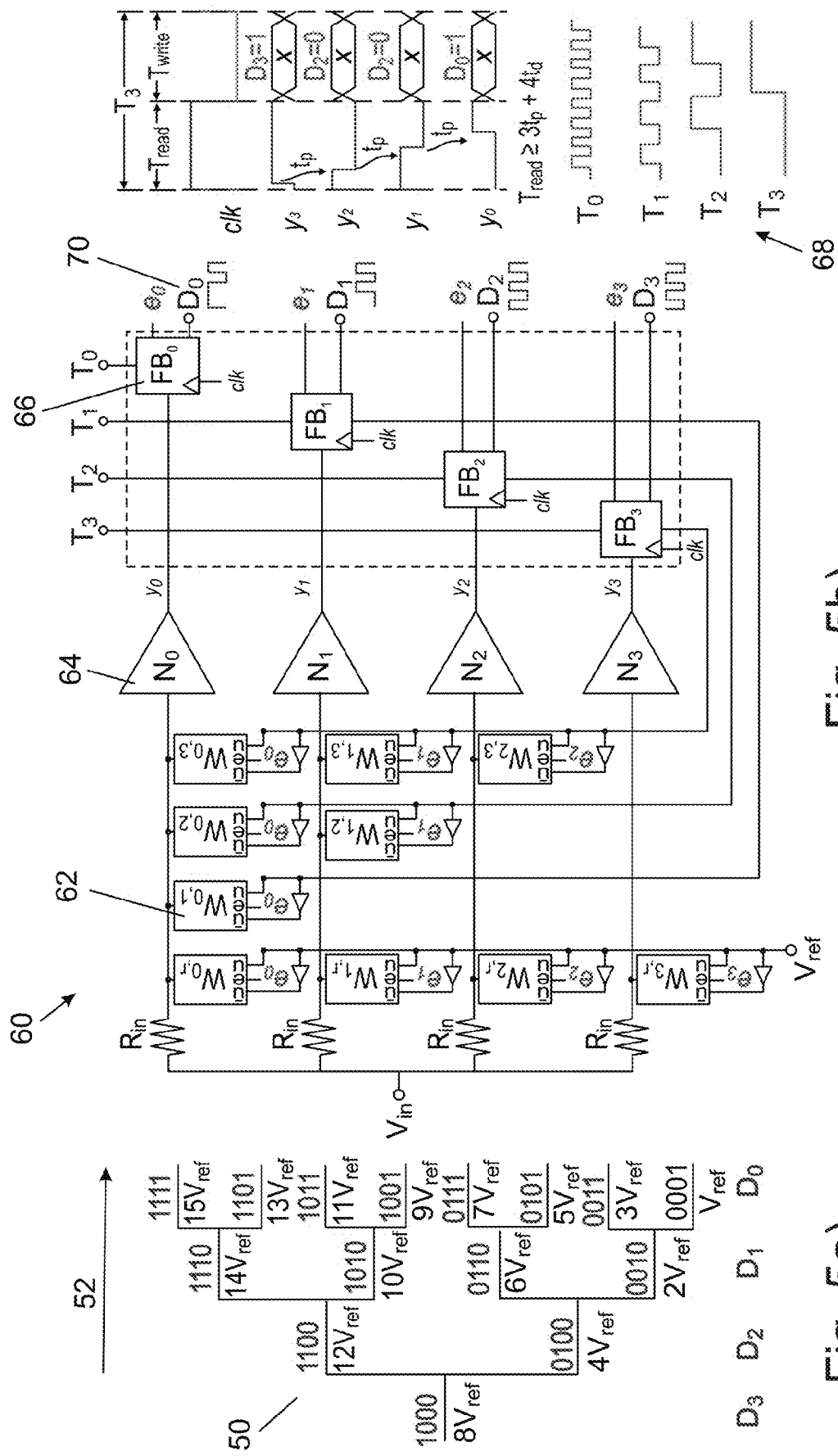
Figure 6A:
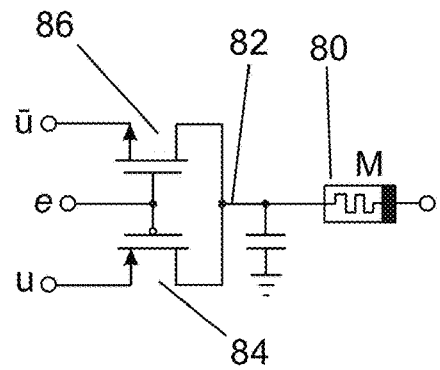
Figure 7A:
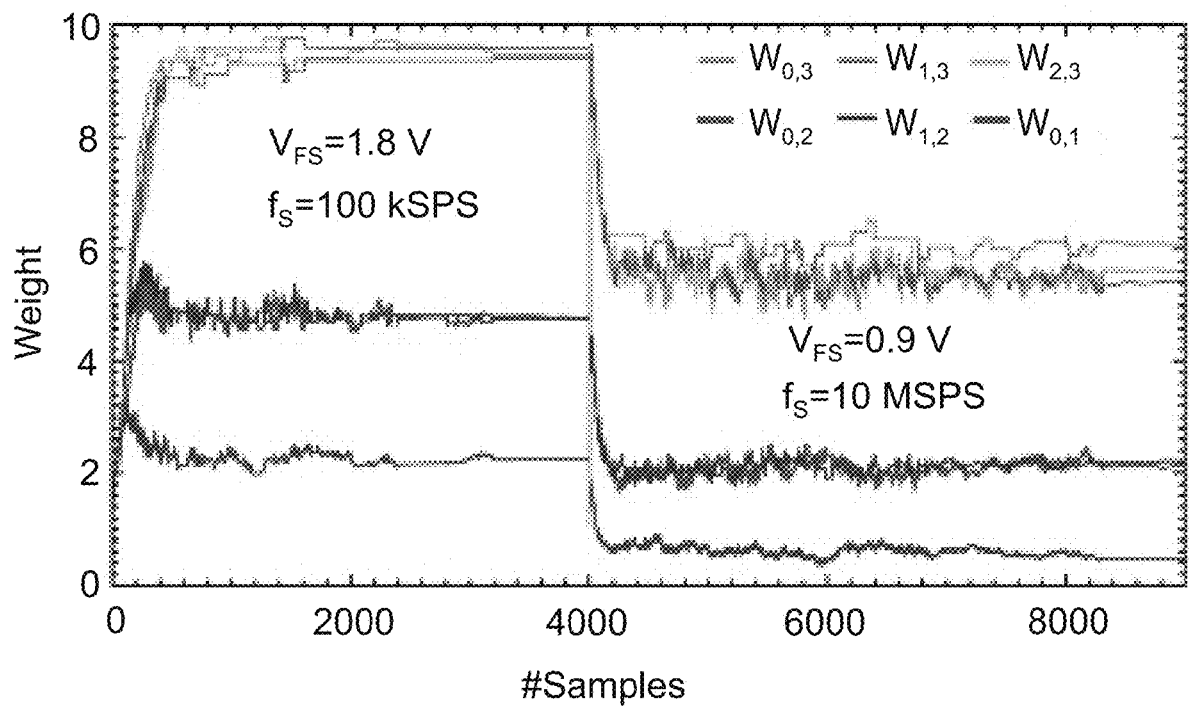
Figure 8A:
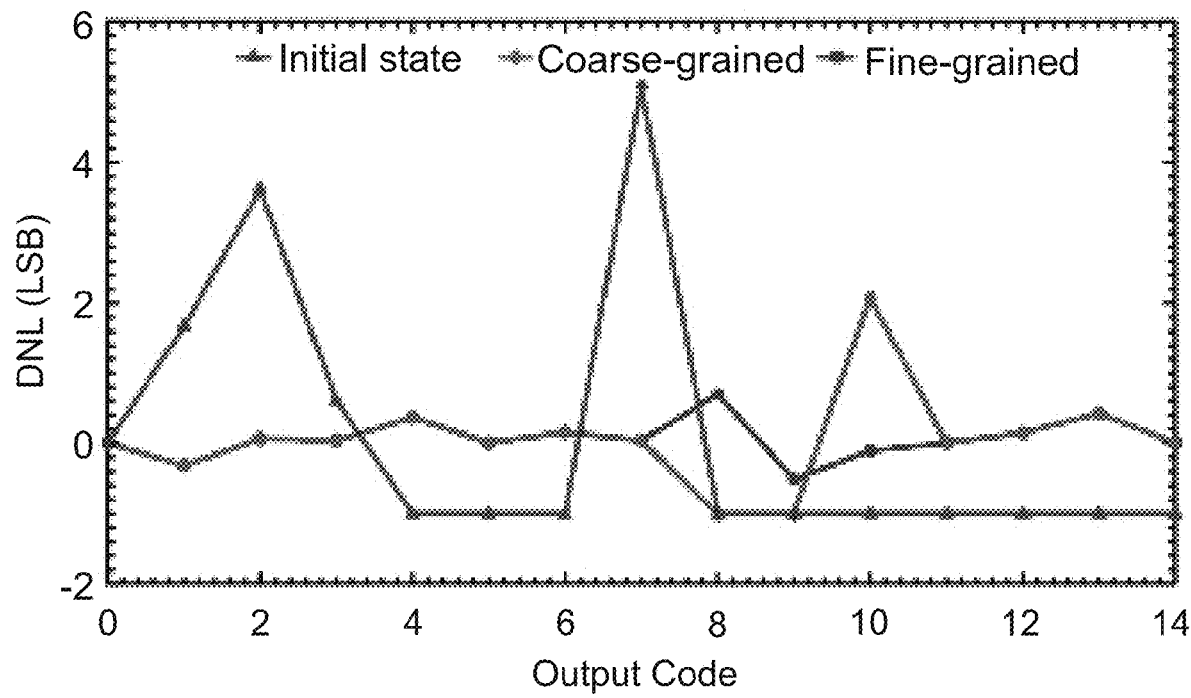
Figure 8B:
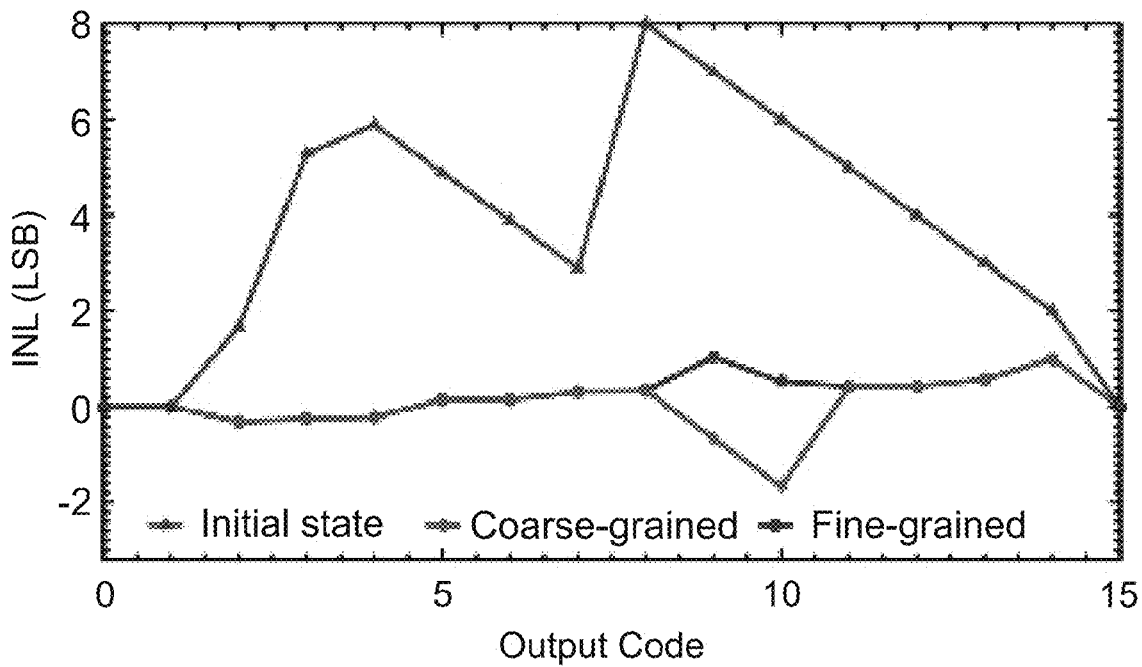
Figure 8C:
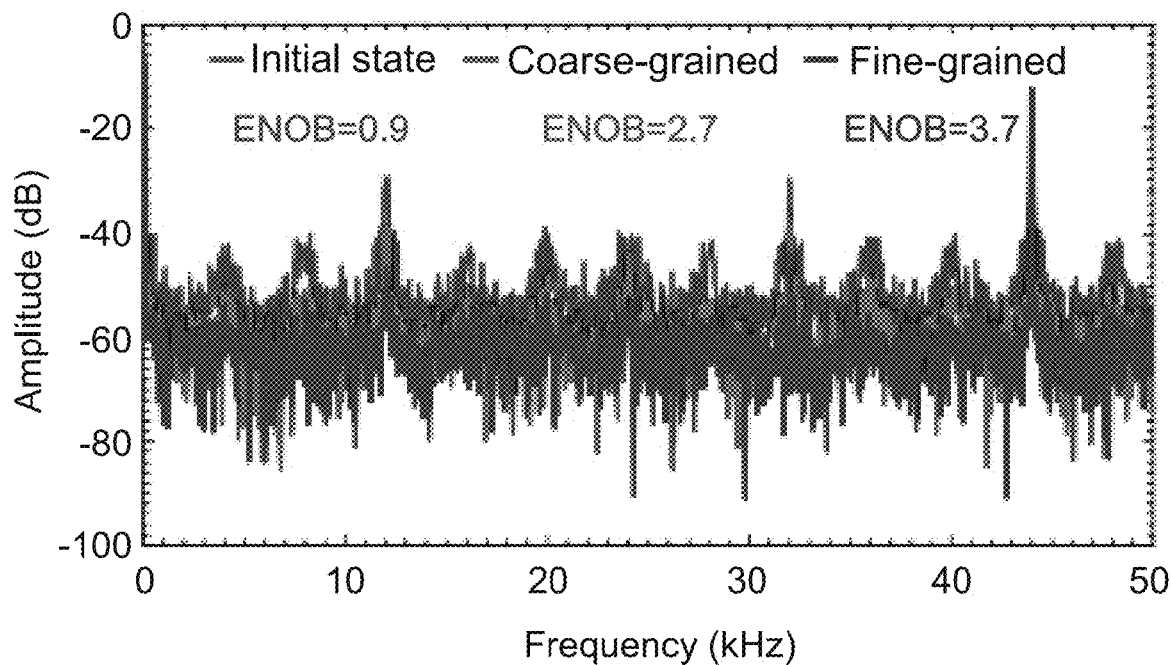
Figure 8D:
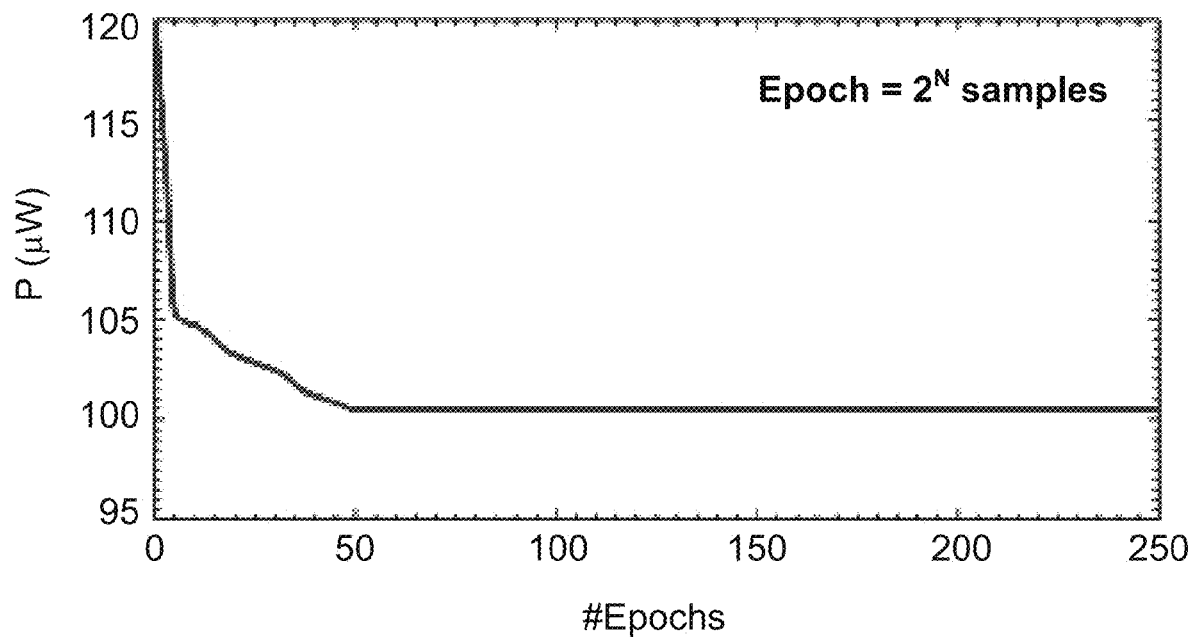
Figure 9A:

FIGS. 3a) to 3d) are four graphs showing tradeoffs involved in optimization in the current art;

FIG. 4 is a comparative graph showing training efficiency in the current art and in the present embodiments;

FIGS. 5a) and b) are a successive approximation flow and a generalized circuit for an embodiment of the present invention;

FIGS. 6a) to 6c) are three building blocks of parts of the circuit of FIG. 5b);

FIGS. 7a) to 7d) are four graphs illustrating aspects of the training procedure according to the present embodiments;

FIGS. 8a) to 8d) are four graphs showing efficiency of the training procedure of FIGS. 7a) to 7d); and FIGS. 9a) to 9d) are four graphs illustrating the speed-power-accuracy tradeoff according to the present embodiments.

DESCRIPTION OF SPECIFIC EMBODIMENTS OF THE INVENTION

The present invention, in some embodiments thereof, relates to an analog to digital converter (ADC) using memristors in a neural network.

The analog-to-digital converter (ADC) is a principal component in every data acquisition system. Unfortunately, modern ADCs tradeoff speed, power, and accuracy. In the present embodiments, novel neuroinspired approaches are used to design a smart ADC that could be trained in real time for general purpose applications and break through conventional ADC limitations. Motivated by artificial intelligent learning algorithms and neural network architectures, the proposed ADC integrates emerging memristor technology with CMOS. We design a trainable four-bit ADC with a memristive neural network that implements the online gradient descent algorithm. This supervised machine learning algorithm fits multiple application specifications such as full-scale voltage ranges and sampling frequencies. Theoretical analysis, as well as simulation results, demonstrate highly powerful collective properties, including reconfiguration, mismatch self-calibration, adaptation to dynamic voltage and frequency scaling, noise tolerance, and power consumption optimization. The proposed ADC may achieve up to 8.25 fJ/conv FOM, 3.7 ENOB, 0.4 LSB INL, and 0.5 LSB DNL. These properties make it a leading contender for general purpose and emerging data driven applications.

That is to say, the present embodiments take a different approach to design general purpose ADCs. In the present embodiments the converted data is used to train the converter in order to autonomously adapt to the exact specifications of the running application as well as to adjust to environmental variations. This approach may reduce the converter's time to market, efficiently scale with newer technologies, drastically reduce its cost, standardize the design flow, and enable a generic architecture for general purpose applications. The proposed trainable ADC utilizes machine learning (ML) algorithms to train an artificial neural network (ANN) architecture based on the promising technology of memristors. Memristors are now being widely adopted in the design of synapses for artificial neural systems because of their small footprint, analog storage properties, energy efficiency, and non-volatility. These characteristics allow for synapse-like behavior, where the conductance of the memristor is considered as the weight of the synapse. We leverage the use of memristors as synapses to achieve high-precision, high-speed, low-power, a simple cost-efficient, and reconfigurable single channel ADC architecture that breaks through the speed-power accuracy tradeoff. Reference is made to applicant's earlier patent application regarding online training of memristive synapses and on digital-to-analog converter (DAC).

We explain the motivation behind our approach, followed by an ADC architecture, theory, and training algorithm. A circuit design and mechanisms of a four-bit ADC are detailed as an exemplary embodiment. The circuit operation and learning capability of the embodiment are evaluated. Design trade-offs and large-scale issues are discussed, and this is followed by a conclusion.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1:
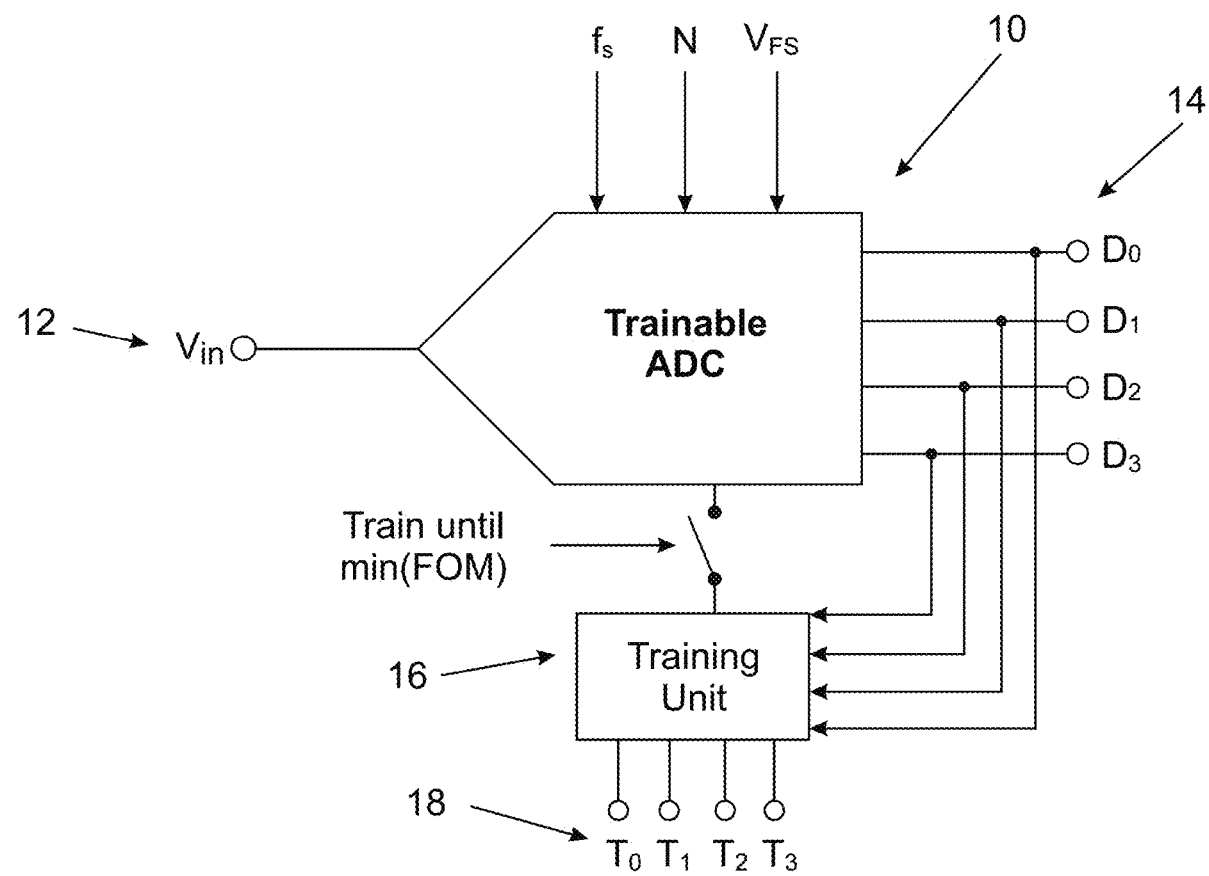
FIG. 1 is a simplified block diagram showing a trainable ADC according to an embodiment of the present invention.

Reference is now made to FIG. 1, which is a simplified block diagram illustrating an analog to digital converter 10 according to an embodiment of the present invention. The analog to digital converter has an input 12 for receiving an analog input signal. Outputs 14, here shown by way of example as four outputs $D_0$ to $D_3$, output parallel bits of a digital signal that represents said analog input signal. It is to be noted that other numbers of output bits may be provided as appropriate for the particular use. The converter 10 is trainable and, as will be described in greater detail below, one or more neural network layers provide connections between each of the outputs. Each connection has an adjustable weighting whose level is set by a training process. More particularly, the connections include adaptable synapses so that the weightings may be adjusted by the training procedure. In operation, each adaptable synapse is set with a particular weighting, so that each output bit is a different weighted sum of all of the previous, or current, output bits. In embodiments a comparator is used to obtain a comparison result that is based on the weighted sum.

In embodiments, memristors, which have adjustable resistance, are used to provide the adjustable weightings to the connections. Each memristor is set with a particular weight by the training procedure. Training may be carried out in advance, and/or during the course of use.

For training in advance, a training unit 16 is connected to the output digits 14, which it compares to training bits $T_0 \ldots T_3$ from a training dataset input 18. The training unit adjusts each of the adaptable synapses until outputs of a given input correspond to a training dataset. The training data set may be selected for a given maximum voltage and a given number of input bits, although the frequency may be varied. Training may then guarantee power consumption minimization and effective number of resolution bits (ENOB), which is equivalent to minimization of the figure of merit (FOM).

The adjustment may be carried out using online gradient descent. Online gradient descent comprises iterations k of:

$$W^{(k+1)} = W^{(k)} - \frac{\eta}{2} \nabla_{W^{(k)}} \sum_{i=0}^{N-1} (D_i^{(k)} - T_i^{(k)})^2$$

wherein $\eta$ is a learning rate, $Vi^{(k)}$ is a single empirical sample provided to the input at the $k^{th}$ iteration, and:

$$\Delta W_{ij(j>i)}^{(k)} = -\eta(T_i^{(k)} - D_i^{(k)})T_j^{(k)}$$

The adjusting may involve minimizing a figure of merit, as will be discussed in greater detail hereinbelow. Minimizing may involve minimizing a training error function and an energy cost function, and as a result the figure of merit, which may be a formula that combines such functions. The figure of merit may for example be given by the following formula:

$$\frac{P}{2^{ENOB} \cdot f_s} \left[ \frac{J}{conv} \right]$$

wherein P is a power dissipation during conversion, fs is a sampling frequency and:

$$ENOB = \frac{SNDR(dB) - 1.76}{6.02}$$

SNDR is a signal and noise to distortion ratio. More particularly, FIG. 1 shows trainable 4-bit ADC 10 which receives signals fs, VF S, N and is trained in real-time by providing a specific teaching dataset Ti. The training continues until the ADC achieves the optimal FOM.

Figure 2:
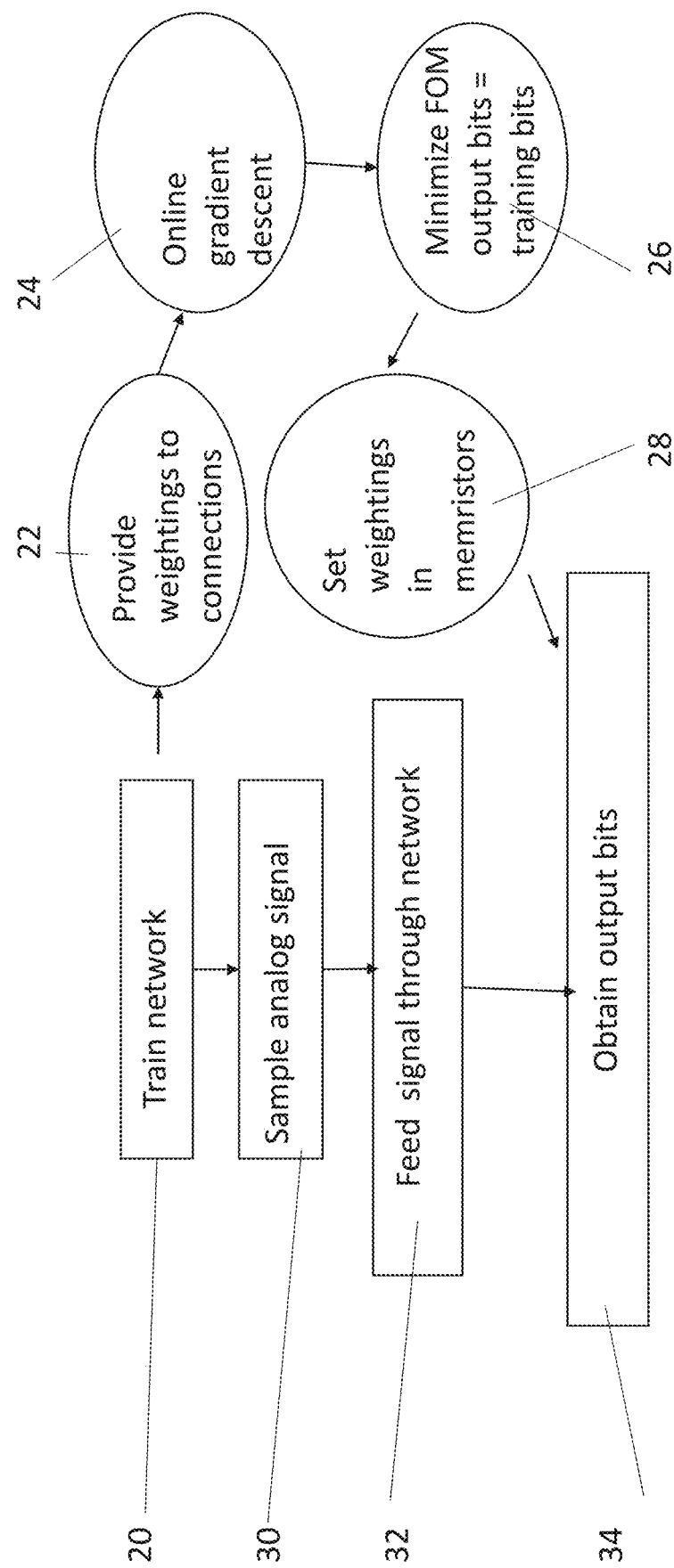
FIG. 2 is a simplified flow chart showing how training of the neural network is carried out according to the present embodiments using an input and a training signal.

Reference is now made to FIG. 2, which is a simplified diagram showing an analog to digital conversion method using the device shown in FIG. 1. A network of connections between the outputs is initially trained—20. Prior to training, a sampling frequency may be selected. Training involves providing weightings to the memristor based connections forming the neural network layer between the output bits—22. The weightings are provided using online gradient descent 24 as defined above and minimizing a figure of merit 26. The results are then set into the memristors 28.

Both during the training and during use an analog input signal is received and sampled 30. The samples are fed 32 through the trained neural network, and the output bits are obtained 34 to provide a digital representation of the input analog signal. During training the output bits are compared to training bits which represent the correct answer that the converter is supposed to achieve and the weightings are adjusted as described until the difference between the output bits and the training bits is minimized.

The embodiments are now considered in greater detail.

A. Speed-Power-Accuracy Tradeoff in ADC Architectures

While the analog domain is mainly characterized by its energy efficiency in data processing, its digital counterpart outperforms it in reliable computation. ADCs are mixed-signal systems that inherently combine hybrid analog-digital principles along with the pros and cons of each domain. Therefore, these systems are optimally customized to fit a specific subset from a wide functional spectrum. Design tradeoff is an extreme case when the system is pushed toward its performance limits. The ADC comprises a signal sampler that discretely samples the continuous-time signal at a constant rate, and a quantizer that converts the sampled value to the corresponding discrete-time N-bit resolution binary-coded form. The quality of a system is considered ideal when it achieves high speed and accuracy with This paper proposes a proof-of-concept of a real-time trainable ADC architecture for general purpose applications, which breaks through the speed-power-accuracy tradeoff. Motivated by the analogies between mixed-signal circuits and the neuromorphic paradigm, we exploit the intelligent properties of an ANN, and suggest a pipelined SAR-like neural network architecture ADC that is trained online by a supervised ML algorithm.

The neural network of the present embodiments may share the Hopfield energy model, and we show the equivalence between the energy function to the conversion cost function and the training error function after the training is complete.

The neural network may be realized by means of a hybrid CMOS-memristor circuit design. The trainable mechanism may show collective properties of the network in reconfiguration to multiple full-scale voltages and frequencies, mismatch self-calibration, noise-tolerance, stochastic resonance, power optimization, and FOM dynamic scaling. We believe that an ADC according to the present embodiments may constitute a milestone with promising results for large-scale architectures of data converters and emerging realtime adaptive applications with varying conditions, such as wearable devices and automotive applications.

While the analog domain is mainly characterized by its energy efficiency in data processing, its digital counterpart outperforms it in reliable computation. ADCs are mixed-signal systems that inherently combine hybrid analog-digital principles along with the pros and cons of each domain. Therefore, these systems are optimally customized to fit a specific subset from a wide functional spectrum. Design tradeoff is an extreme case when the system is pushed toward its performance limits. The ADC comprises a signal sampler that discretely samples the continuous-time signal at a constant rate, and a quantizer that converts the sampled value to the corresponding discrete-time N-bit resolution binary-coded form. The quality of a system is considered ideal when it achieves high speed and accuracy with a low power drain. In practice, however, the resolution decreases as the conversion rate increases, and greater power consumption is required to achieve the same resolution.

Device mismatch is the dominant factor affecting system accuracy. Larger devices are necessary to improve system accuracy, but the capacitive loading of the circuit nodes increases as a result and greater power is required to attain a certain speed. The maximal speed of the system is a function of the gain-bandwidth, but it is limited by the input pole.

Aside from device mismatches, four loss mechanisms affect the ADC resolution and limit the signal-to-noise-and-distortion ratio (SNDR): quantization noise, jitter, comparator ambiguity, and thermal noise. Quantization noise is the only error in an ideal ADC. Jitter is a sample-to-sample variation of the instant in time at which sampling occurs. Additionally, the conversion speed is limited by the ability of the comparator to make assertive decisions regarding the relative amplitude of the input voltage. This limitation is called comparator ambiguity and it is related to the speed of the device used to fabricate the ADC. Device speed is measured as the frequency, fT, at which there is unity current gain. As a result of these limitations, approximately one bit of resolution is lost each time the sampling rate doubles. Whereas non-linear distortions, memory effects, and device mismatches can be somewhat compensated for, thermal white noise cannot; consequently, it is one of the more dominant limiters of ADC performance. It is modeled by KT/C noise, where K denotes Boltzmann's constant, T denotes temperature, and C denotes sampler capacitance. Lowering the noise floor by a factor of two in purely thermal-noise limited circuits would quadruple the power consumption. The limit that device mismatch imposes on the power consumption is approximately two orders of magnitude higher than the limit imposed by thermal noise.

Reference is now made to FIGS. 3a) to 3d). Tradeoffs in conventional ADC architectures between (a) speed and accuracy, (b) speed and power, (c) accuracy and energy are shown. Since the power-accuracy tradeoff depends on the limitations of the underlying architectures, the energy-accuracy is independent of the architecture and shows the tradeoff accordingly. FIG. 3(d) is a spider diagram of ADC architectures (different color lines), design tradeoff, and associated applications (in blue). The speed-power-accuracy tradeoff is illustrated in FIG. 3(a)-(c); and is based on data that we have processed from Stanford's ADC survey, which includes papers published during the last two decades.

The need to digitize so many signal types has produced a broad range of data converters diverse in their resolution, sampling rates, and power consumption budget. These considerations profoundly affect system architectures and their performance.

The speed-power-accuracy tradeoff has resulted in a wide range of ADC architectures optimized for special purpose applications, from high-speed, to high-resolution, to low-power applications. FIG. 3(d) specifies the widely used ADC architectures, each mapped to its market applications.

B. ADC Figure-of-Merit (FOM)

When comparing ADCs with different specifications, a numerical quantity known as a figure of merit (FOM) is used to characterize the performance of each ADC relative to its alternatives. Two or more metrics can be combined into a single FOM that accurately reflects the merits of the ADC in a certain context and for a specified purpose. One of the most widely used FOMs is defined as:

$$FOM = \frac{P}{2^{ENOB} \cdot f_S} \left[\frac{J}{conv}\right], \quad (1)$$

and relates the ADC power dissipation during conversion, P, to its performance in terms of sampling frequency, fs, and effective number of resolution bits (ENOB). Lower FOM values will result in better ADC performance. The ENOB is calculated from the SNDR as:

$$ENOB = \frac{SNDR(\text{dB}) - 1.76}{6.02}. \quad (2)$$

The aforementioned FOM best captures the fundamental speed-power-accuracy tradeoff. The ongoing saga of CMOS technology trends toward smaller transistor dimensions has resulted thus far in ultra-deep submicron transistors.

The FOM evolution also best describes Moore's law of ADCs. Technology scaling improves sampling frequencies, because fT allows for faster operation. However, the speed of sampling frequency is limited by the comparator ambiguity. In the same context, the impact of technology scaling on power dissipation optimization is also limited by the supply voltages, and by leakage currents that inevitably lead to an increase in the power consumption required to maintain SNDR. These limitations, along with manufacturing process variations and device mismatches in ultra-deep submicron technologies, are the biggest obstacle to achieving high linearity, wide dynamic range, and high-resolution converters. Thus, the speed power-accuracy tradeoff is becoming dramatically more severe with technology downscaling, pushing future data converters out of the application band of interest.

Reference is now made to FIG. 4, which illustrates average FOM evolution versus technology node scale-down of the different ADC architectures and specifications shown in FIG. 1. Overall, the FOM improves with the technology scaledown. However, the asymptotic slowdown in the last decade is shown by the trendline. The green star 40 shows the achieved FOM based on the present embodiments and shows an overall improvement in the FOM over the technology nodes. Improvements in general, that is apart from considering star 40 may be due to low-resolution converters that benefit from technology scaling. However, the improvement has slowed down significantly and ADC performance has recently saturated. The noise-floor has saturated during the last decade, indicating that future ADCs could very well fail to maintain even the current state-of-the-art in noise performance.

C. Trainable ADC for General Purpose Applications

Techniques for circumventing the tradeoff have recently been investigated, with the goal of achieving ultra-low-power consuming converters with high resolution through a combination of systematic, architectural and technological approaches. Examples of such methods are digitally assisted background calibration, time-interleaving, pipelining, sub-ranging, folding, interpolating, and oversampling. These techniques have succeeded in postponing the FOM saturation.

Modern ADC architectures are custom designed circuits that are fine-tuned to optimize specific capabilities and design parameters up to the application's specification. Widely used methods are sophisticated, specific, and technology dependent, lacking standard design flow. These methods require exhaustive characterization, massive validation, and relatively long development time-to-market. Furthermore, a rapid increase in multi-channel ADCs has recently been observed. Multiple channels are monolithically integrated for diversity-based applications, increasing the total area, cost, design complexity and power consumption.

In the same context, reconfigurable architectures that dynamically select between a narrow range of different predefined design specifications have been developed. In contrast, minimalistic design approaches have been proposed to improve power efficiency and potentially increase speed by utilizing simplified analog sub-circuits. Future collective improvements in the ADC FOM will most probably be derived from a combination of factors that will include novel architectures, an emerging technology device beyond CMOS, and a systematic approach beyond Moore's law.

The field of machine learning (ML) is devoted to the study and implementation of systems capable of learning from data using their evolving perceptual ability to make crucial decisions, predictions, and classifications based on examples learned from the past. Data conversion could be viewed as a special case of the classification optimization and signal restoration problem that could easily be solved using ML to learn from the data.

Returning to FIG. 1 and the present embodiments may provide a trainable ADC architecture for general purpose applications. In the present embodiments, a set of parameters is determined to meet the requirements of the running application. First, the sampling frequency fs is determined, followed by the number of resolution bits N, followed by the full-scale voltage VF S, which specifies the ADC input dynamic range. Then, the ADC is trained by a ML algorithm in real-time to optimize the ENOB and power dissipation. This procedure is equivalent to a dynamic FOM optimization, which will be proven in this work to potentially achieve a much lower FOM 40 than the trend-line in FIG. 4.

The technique is not exclusive to reconfiguration, but can also be applied for device mismatch self-calibration, adaptation, and noise tolerance, using generic, standard methodology. Furthermore, the trainability of the architecture adds flexibility that makes it cost-effective and versatile, with a minimalistic design that uses one channel and an intelligent ML algorithm.

III. Neural Network ADC

Neuromorphic computing is a mixed-signal design that inherently combines both analog and digital domains in its molecular, biophysical, behavioral, and functional abstraction levels. Extrapolating from electronics to neurobiology, it may be concluded that the brain computes efficiently in a hybrid fashion. Analogously, the present embodiments may interpolate perceptual abilities from neurobiology to mixed-signal electronics to break through the derived design tradeoffs and utilize the advantages of both domains.

ANNs are receiving widespread attention as potential new architectures and model implementations for a diverse assortment of problems, such as pattern classification, object recognition, and signal processing. Furthermore, ANNs are considered an efficient abstract platform for ML algorithms and big-data interpretation. The massively parallel processing power of the neural network lies in the cooperation between highly interconnected computing elements (neurons), connected by long-term memory elements (synapses). Furthermore, the trainable and adaptive capabilities of ML algorithms are considered novel intelligent features providing an impetus in specific areas where conventional computers perform poorly compared to our brain. Herein, the present embodiments may provide a neural network ADC paradigm. We show its architecture, fundamentals, theory, and an ML algorithm to train the network.

A. Architecture

ANN architectures are distributed networks that collectively make decisions based on the adjustment of successive approximation weights. Strikingly, this mechanism precisely describes ADCs in time-scale with successive binary-weighted approximation, such the SAR ADC. While bit comparison is equivalent to neural activation, each reference scale during the successive binary search algorithm is equivalent to a binary weighted synapse. As a first step, we start with transforming the temporal binary search algorithm of 4-bit SAR conversion to a spatial neural network with binary-weighted synapses and pipelined forward propagated neurons (MSB to LSB), $$\begin{cases} D_3 = u(V_{in} - 8V_{ref}) \\ D_2 = u(V_{in} - 4V_{ref} - 8D_3) \\ D_1 = u(V_{in} - 2V_{ref} - 4D_2 - 8D_3) \\ D_0 = u(V_{in} - V_{ref} - 2D_1 - 4D_2 - 8D_3) \end{cases} \quad (3)$$

where Vin is the analog input and $D_3D_2D_1D_0$ is the corresponding digital form (i=3 is the MSB), and each bit (neuron product) has either zero voltage or full-scale voltage. u(•) is denoted as the signum neural activation function, and Vref is a reference voltage equal to the smallest discrete voltage quantum (LSB). Each neuron is a collective integrator of its inputs. The analog input is sampled and successively (by a pipeline) approximated by a combination of binary-weighted inhibitory synaptic connections.

The approximation procedure of determining each bit in the ADC is modular. The MSB voltage $D_3$ can first be determined independently of other bits by comparing to the middle of the full-scale voltage. When $D_3$ is known, it is bypassed to the second MSB, which can be found regardless of $D_1D_0$. If $D_3$ is '1', then $D_2$ is compared to three-quarters of the full-scale; otherwise it is compared to one-quarter of the full-scale. Analogously, the LSBs are approximated based on the driving MSBs. The successive approximation flow, in a SAR-like neural network, is described by a binary-search tree 50 with all the possible combinations, as shown in FIG. 5(a). Each neuron makes a decision, which takes time td, and drives other neurons forward in an asynchronous pipeline and with strength (synaptic weight) proportional to its significance degree, during the read cycle after propagation time tp. The total propagation time, indicated by arrow 52, be less than the read cycle duration.

In a real-time operation where non-ideal, non-linear, stochastic, and varying conditions affect the conversion accuracy, the correct weights are not distributed deterministically in binary weighted style. In this case, the weights should be updated in real-time in situ by a training feedback. Four different binary-weighted weights are needed to implement a 4-bit ADC, and 24 different precise weights around each binary-weighted weight are required to fine-tune the LSB neuron. The interconnected synaptic weights of the network are described by a matrix W, and each element Wij represents the weight of the connection from pre-synaptic neuron j to post-synaptic neuron i. The neural network ADC architecture including its building blocks (neurons, synapses, and feedbacks) is illustrated in FIG. 5(b). More particularly, a neural network 4-bit ADC architecture 60 may include synapses Wi,j, 62, leading to neurons Ni 64, and feedbacks FBi 66. A wave diagram of the neural activity during forward propagation among bits 68 shows how the signals for the succeeding bits increases. The propagation time of neural decisions 52 should be less than the read cycle. The digital outputs Di 70 are sampled at the read-cycle end, and then are latched for the write cycle to compare with the teaching data-set Ti, which corresponds to the analog input ramp. Read and write dependent signals are marked in blue and red, respectively.

Theory

Surprisingly, the architecture used in the present embodiments contains an equivalence to a well-studied architecture with emergent collective computational properties. A simple single-layer neural network was developed from a complex Hopfield neural network. The originally proposed Hopfield network is considered a sub-type of recurrent neural networks with a parallel single layer that comprises fully-connected neurons with inhibitory feedbacks, bidirectional data traversal, and without auto-feedback. From a design point of view, a Hopfield network with symmetric connections is especially convenient for the ADC task.

Most interestingly, the ADC is based on an energy function that describes the macroscopic dynamics of the network. The energy function characterizes the energy minimization process and recursive convergence of the network from an initial state to a minimum energy in steady state. The energy function is used as a network cost function customized for solving specific optimization problems. By defining the energy function, one can easily extract the corresponding weights that fit the network specifications and application demands.

Hopfield networks suffer, however, from several drawbacks that limit their use for practical applications. Due to the complex nature of the energy function, the solution of this symmetric network is highly dependent on its initial state. The energy function might decrease and then settle to one of the equilibrium points, called "spurious state" or "local minima," that does not correspond to the correct digital representation of the input signal and results in ADC characteristics that are far from ideal. Fortunately, these non-linearities can be eliminated using a modified Hopfield network with an additional self-correcting logic network and an extended resistive network. Another elimination technique is to use separate electronics that force the neurons to reset, alternately limiting the operational frequency and ADC speed. Moreover, Hopfield networks also suffer from structural shortcomings, especially at a large scale: a large number of synapses, a high ratio between weights, and quantization errors. Recently, a level-shifted 2-bit Hopfield based ADC quantizer was proposed to overcome the original Hopfield network scaling shortcomings and eliminate the digital error that grows along with the number of bits.

The ADC architecture of the present embodiments is equivalent to a particular class of asymmetric Hopfield-type networks, and has been designed to overcome the Hopfield network drawbacks and stability issues. The equilibrium point is globally attractive, globally asymptotically stable and guaranteed; that is, the system will converge toward this point for every choice of initial condition and for every choice of non-linearities. Furthermore, neural networks with lower block triangular interconnection structure for robust ADC application have been widely explored in the literature, including their mathematical justification, formalization, qualitative analysis, quantitative asymptotic constraints for stability, encoding techniques, and synthesis.

Analogously to the Hopfield energy function, we describe the energy function of the proposed asymmetric architecture as:

$$E = -\sum_{i=0}^{N-1}\sum_{j=i+1}^{N-1} W_{ij}D_iD_j - \sum_{i=0}^{N-1} D_i(V_{in}W_{i_{in}} + V_{ref}W_{i_r}), \quad (4)$$

where Wij is a synapse (conductance) between a pre-synaptic neuron with index j and digital voltage Dj, and a post-synaptic neuron with index i and digital voltage Di, as shown in FIG. 5(b).

The derivative of E according to Di, which is equivalent to the inverting sum of neuron i input currents, is negative. Thus, E is a monotonically decreasing function and achieves minimal value when Di changes to guarantee a zero total current over the whole ramp input. The first component refers to the power dissipation of the interconnected synapses, taking the network asymmetry into consideration (j counts from i). The second component refers to the external dissipated power composed of the analog input voltage source and the reference voltage source.

The strategy employed in creating (4) is to consider the ADC as an optimization problem implemented by the following error function EQ, which is formalized analogously as:

$$E_Q = \frac{1}{2}\left(V_{in} - \sum_{i=0}^{N-1} D_i 2^i\right)^2 - \frac{1}{2}\sum_{i=0}^{N-1}(2^i)^2[D_i(D_i - 1)], \quad (5)$$

where the first component is the power of the quantization error. It will achieve minimal value when the digital code corresponds to the correct analog input. The second component is added to eliminate diagonal elements (self-feedback), and its value is always zero. By reordering (5) as an energy-like function, similarly to (4) we get:

$$E_Q = 2^N \cdot \left[-\sum_{i=0}^{N-1}\sum_{j=i+1}^{N-1}(-2^j)D_iD_j - \sum_{i=0}^{N-1} D_i(V_{in} - 2^{i-1})\right], \quad (6)$$

where 2N is a constant and does not affect the optimal weights for the ADC network. We extract the weights by comparing (6) to (4): $W_{ij(j>i)}=-2^j$, $W_{ij(j\le i)}=0$, $W_{ii\_n}=1$, $W_{i_r}=-2^{i-1}$. These values are typical for a deterministic ADC like the one calculated in (3).

Unlike in a Hopfield network, the convergence of the energy function toward its minimum in the network according to the present embodiments is globally attractive and unaffected by the transient behavior of the circuit elements. Moreover, the network according to the present embodiments outperforms the Hopfield network in terms of scalability: the number of synapses is halved, and each weight value is reduced by 2i.

In the following, we show that the network converges after training to the minimum energy level.

C. Training Algorithm

The learning capability of the asymmetric Hopfield network was thoroughly investigated. A learning algorithm based on the least mean square (LMS) algorithm was introduced, and several specific examples were considered to demonstrate the learning ability, network flexibility, linear separability for conversion, and the effectiveness of LMS in training the asymmetric network as compared to the Hopfield and multi-layer neural networks. The recurrency of the Hopfield network complicates its feasibility for in situ training and adaptivity. Alternately, the Hopfield network could be cascaded by a deep neural network, trained using the backpropagation algorithm, to adaptively calibrate quantization errors and maintain the magnitude of digital output code within a manageable operating voltage range. This extension separates between the training (encoding) path and the conversion (inference) path, which could complicate the feasibility of the scalable level-shifted architecture, consuming a large number of resources, in contrast to the network according to the present embodiments.

Consider the following supervised learning task. Assume a learning system that operates on K discrete trials, indexed by k=1, 2, . . . , K. In each trial k, the system is given an empirical data set of $\{V_{in}, T_i\}$, i=0, . . . , N–1, where $V_{in}^{(k)} \in R$ is a sampled analog pattern, $T_i \in R^N$ is the desired digital label for $D_i^{(k)}$ corresponding to $V_{in}^{(k)}$, and $D_i^{(k)}$ is the actual i-th digital output, with all pairs sharing the same desired relation, $T_i^{(k)}=f(V_{in}^{(k)}, D1, \ldots, Di-1)$. Note that two distinct patterns can have the same label (the same digital level in the ADC case depends on the quantization resolution). The goal of the system is to estimate (learn) the function f(•) using the empirical data.

Suppose W is an asymmetric matrix as discussed, and consider each neuron estimator as:

$$D_i^{(k)} = u\left(V_{in}^{(k)} - \sum_{j>i}^{N-1} W_{ij}^{(k)} D_j^{(k)} + c\right), \quad (7)$$

where u(•) is denoted as the signum neural activation function, and c is a constant that refers to a reference voltage, while each Di behaves as a linear classifier with one output and forward propagates to approximate other outputs. Thus, there is no need for hidden layers, and the signum activation function is sufficient for estimating the function f(•). The network according to the present embodiments could be seen as a concurrent single-layer or a pipelined feedforward multi-layer neural network where each layer determines an output bit. Each estimator $D_i^{(k)}$ should aim to predict the correct teaching labels $T_i^{(k)}$ for new unseen patterns Vin. To solve this problem, W is tuned to minimize some measure of error between the estimated and desired labels, over a $K_0$-long subset of the empirical data, or training set (for which k=1, . . . , $K_0$). Then, a common measure error metric is the least mean square error function defined as:

$$E_{LMS} = \frac{1}{2}\sum_{k=1}^{K_0}\sum_{i=0}^{N-1}\left(D_i^{(k)} - T_i^{(k)}\right)^2, \quad (8)$$

where the ½ coefficient is for mathematical convenience. One can use different error measures as well. The performance of the resulting estimators is then tested over a different subset, called the test set (k=$K_0$+1, . . . , K). A reasonable iterative algorithm for minimizing the error (that is, updating W where the initial choice of W is arbitrary) is the following instance of online stochastic gradient descent, $$W^{(k+1)} = W^{(k)} - \frac{\eta}{2}\nabla_{W^{(k)}}\sum_{i=0}^{N-1}\left(D_i^{(k)} - T_i^{(k)}\right)^2, \quad (9)$$

where η is the learning rate, a (usually small) positive constant, and each iteration k, a single empirical sample $V_{in}^{(k)}$ is chosen randomly and presented at system input. The chain rules (7) and (8) are used to obtain the outer product:

$$\Delta W_{ij(j>i)}^{(k)} = -\eta(T_i^{(k)} - D_i^{(k)})T_j^{(k)}. \quad (10)$$

This update rule is known as the least mean square (LMS) algorithm, used in adaptive filters for signal processing and control. Note that the update rule (10) is local, i.e., the change in synaptic weight Wij (j>i) depends only on the related components $D_i^{(k)}$, $T_i^{(k)}$, $T_j^{(k)}$. This local update, widely used in ANN training and ML algorithms, allows massively parallel acceleration. The training phase continues until the error is below Ethreshold, a small predefined constant threshold that quantifies the learning accuracy. We show below, for the first time, that the error function in (8) after training is proportional to the cost function in (5) and the network energy function in (4). The training algorithm may be implemented by the feedback 66 shown in FIG. 5(b).

Circuit Design

In the following, we present the circuit design building blocks of the ADC architecture of the present embodiments, including its different components: neuron, synapse, and feedback circuit. The design methodologies, operational mechanism, and constraints of the building blocks are further discussed in L. Danial, N. Wainstein, S. Kraus, and S. Kvatinsky, "DIDACTIC: A data-intelligent digital-to-analog converter with a trainable integrated circuit using memristors," *IEEE J. Emerg. Sel. Topics Circuits Syst.*, vol. 8, no. 1, pp. 146-158, March 2018, the contents of which are hereby incorporated herein by reference. For simplicity, we provide the circuit design of the quantization stage and assume that the analog input is sampled separately by means of an external sample-and-hold circuit.

Artificial Synapse

We adopt our synapse circuit design from the above referenced earlier work to provide a single voltage-controlled memristor M 80, connected to a shared terminal 82 of two MOSFET transistors (p-type 84 and ntype 86), as shown in FIG. 6(a). The circuit utilizes the intrinsic dynamics of the memristive crossbar (2T1R), which inherently implements Ohm's and Kirchhoff's laws for ANN hardware realization. The output of the synapse is the current flowing through the memristor. The synapse receives three voltage input signals: u is connected to the source of one transistor, ū=−u is connected to the source of the other, and the enable signal e is connected to the gates of both. The enable signal e can have a zero value, meaning that both transistors are non-conducting, VDD, meaning that only the NMOS is conducting, or −VDD, meaning that only the PMOS is conducting.

The synaptic weight is modified in accordance with the value of e, which selects either input u or ū. Hence, the writing voltage, Vw (or −Vw), is applied via the source terminal of both transistors. Note that the right terminal of the memristor is connected to the virtual ground of an OpAmp, whereas the left terminal is connected to a transistor that operates in the ohmic regime and a shock absorption capacitor. The memristor value Mi,j varies between low and high resistance states, Ron and Roff, respectively. The assumption of transistors in ohmic operation bounds the write and read voltages, and constrains the initial memristive state variable and other design parameters, as further described in our previous work L. Danial, N.Wainstein, S. Kraus, and S. Kvatinsky, "DIDACTIC: A data-intelligent digital-to-analog converter with a trainable integrated circuit using memristors," *IEEE J. Emerg. Sel. Topics Circuits Syst.*, vol. 8, no. 1, pp. 146-158, March 2018, the contents of which are hereby incorporated by reference.

For the design of an ADC in accordance with the present embodiments, we may use an 0.18 μm CMOS process, and memristors fitted by the VTEAM model to the Pt/HfOx/Hf/TiN RRAM device with a buffer layer. This device has a high-to-low resistance state (HRS/LRS) ratio of ~50 and low forming, set, and reset voltages. The circuit parameters are listed in Table I.

Artificial Neuron

The neural activation is the de facto activity in neuromorphic computing that collectively integrates analog inputs and fires output by means of a non-linear activation function. The neural activity is a mathematical abstraction that simply aims to capture some features of real biological neurons. Several implementations of artificial neuron circuits have been suggested in the literature. The neural activation function in the originally proposed Hopfield neural network has some constraints in linearity and monotonicity, as may be implemented using a complicated design to ensure disturbance-free and leakless transient neural activity. Fortunately, in asymmetric Hopfield networks, no such strict constraints are required, and simple digital comparators can be used, while device mismatches, parasitics, and instability issues of the neuron circuit are adaptively compensated for by the synapse.

Figure 6B:
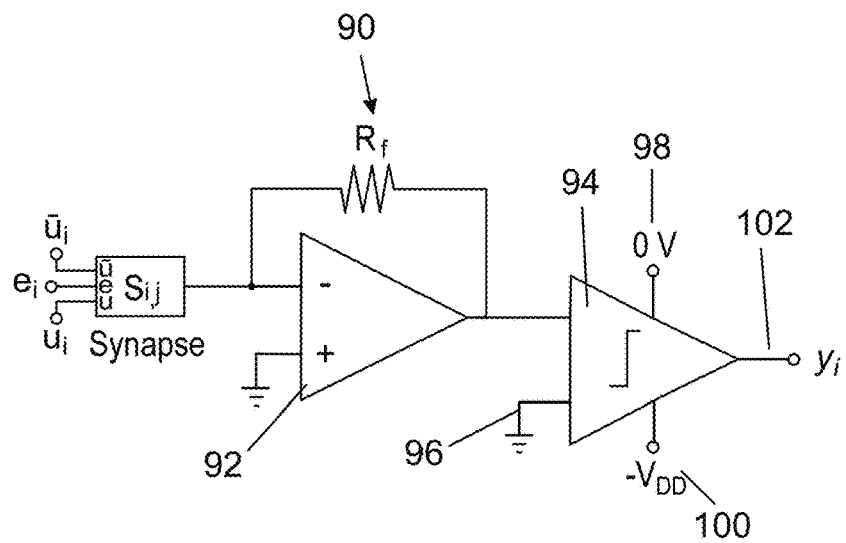

Thus, a neuron circuit may be realized, as shown in FIG. 6(b), by a transimpedance amplifier 90 implemented as an inverting operational amplifier (OpAmp) 92, cascaded to a comparator 94 with zero voltage reference 96, zero voltage Vmax 98, and −Vdd 100 as Vmin to generate negative signs for the inhibitory synapses of the LSBs. The comparator is latched using time-interleaved phased clock, and its decision result (0 V or −Vdd) is sampled at output 102 at the end of the reading cycle Tr, after transient effects are mitigated and neurons synchronized, and their outputs are forward propagated in pipeline. It is latched for the entire writing cycle Tw, and handled by the feedback circuit 66—see FIG. 5b). Note that the effective weights are normalized via the OpAmp 92 and equal to Wij,j>i=Rf/Sij,j>i, where Rf is the negative feedback resistor and Su is the effective resistance of Mu and the serial transistor.

Feedback Circuit

Figure 6C:
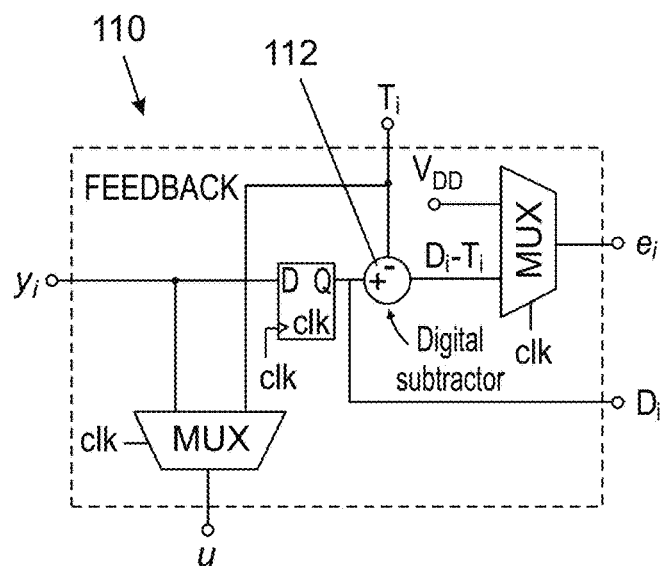

The online gradient descent algorithm is executed by the feedback circuit 66, which precisely regulates the synaptic adaptation procedure. An aim is to design in hardware and execute basic subtraction and multiplication operations. The ADC system is more sophisticated than an equivalent learning based DAC system and has stronger applicative impact; however, its training circuit design is much simpler because $D_i^{(k)}$, $T_i^{(k)}$, $T_j^{(k)}$ are digital values that do not require modulation techniques. The subtraction product $(T_i^{(k)}-D_i^{(k)})$ is implemented by a digital subtractor. An implementation of a feedback circuit 110 including a digital subtractor 112 is shown in FIG. 6(c). The subtraction result of each neuron (other than the MSB) is backward propagated as an enable signal e simultaneously to all its synapses (FIG. 6a). The multiplication is invoked as an AND logic gate via the synapse transistors and controlled by e, whereas the attenuated desired digital output $T_i^{(k)}$ is connected via the source of the synapse. All circuits are controlled by interchangeable synchronous read and write clock cycles with the ADC sampling frequency fs. After the training is complete, that is the error is reduced below a predetermined threshold (E≤E-threshold), the feedback is disconnected from the conversion path.

Evaluation

In the following, a four-bit ADC embodiment is discussed and evaluated in a SPICE simulation (Cadence Virtuoso) using a 0.18 μmCMOS process and the VTEAM memristor model. First, the learning algorithm is evaluated in terms of least mean square error and training time. Next, the circuit is statically and dynamically evaluated, and finally power consumption is analyzed.

The functionality and robustness of an embodiment of the present invention were comprehensively tested under extreme conditions using MATLAB. The design parameters and constraints are listed in Table I. Furthermore, circuit variations and noise sources are quantified and validated, as listed in Table II.

TABLE I

CIRCUIT PARAMETERS

| Type | Parameter | Value | Type | Parameter | Value |
|---|---|---|---|---|---|
| Device parameters | | | Design Parameters | | |
| Power supply | $V_{DD}$ | 1.8 V | Shock capacitor | $C_{shock}$ | 100 fF |
| NMOS | W/L | 10 | Writing voltage | $V_W$ | ±0.5 V |
| | $V_{T_n}$ | 0.56 V | Reading voltage | $V_r$ | −0.1125 V |
| PMOS | W/L | 20 | Feedback resistor | $R_f$ | 45 kΩ |
| | $V_{T_p}$ | −0.57 V | Reading time | $T_r$ | 5 μs |
| Memristors | $V_{on/off}$ | −0.3 V, 0.4 V | Writing time | $T_w$ | 5 μs |
| | $K_{on/off}$ | −4.8 mm/s, 2.8 mm/s | Parasitic capacitance | $C_{mem}$ | 1.145 fF |
| | $\alpha_{on/off}$ | 3, 1 | Parasitic inductance | $L_{mem}$ | 3.7 pH |
| | $R_{ON}$ | 2 kΩ | Input resistance | $R_{in}$ | 45 kΩ |
| | $R_{OFF}$ | 100 kΩ | Comparator bandwidth | BW | 4 GHz |
| | f(s) | s · (1 − s) | OpAmp gain | A | 100 |
| ADC parameters | | | Learning parameters | | |
| Sampling frequency | $f_s$ | 0.1 MSPS | Learning rate | η | 0.01 |
| Number of bits | N | 4 | Error threshold | $E_{threshold}$ | 2 · 10⁻³ |
| Full-scale voltage | $V_{FS}$ | $[\frac{V_{DD}}{2} - V_{DD}]$ | | | |

TABLE II

CIRCUIT VARIATIONS & NOISE

| Type | Nominal value | Variance |
|---|---|---|
| Device mismatch | | |
| Resistor | W = 2 um, $R_\square$ = 50 Ω/□ | ±0.5% um |
| Capacitor | W = 0.15 um, $C_A$ = 0.68 fF/um² | ±1% um |
| NMOS/PMOS | W/L | ±10% |
| | $V_T$ | $\frac{A_{V_T}}{\sqrt{WL}}$ = 7.14 mV |
| Sampler | τ | 400 ps |
| OpAmp finite gain | $-\frac{\frac{R_f}{R_{on}}}{1+(1+\frac{R_f}{R_{on}})/A}$ | 81 |
| Comparator | $V_{offset}$ | 5 mV |

TABLE II-continued

CIRCUIT VARIATIONS & NOISE

| Type | Nominal value | Variance |
|---|---|---|
| Memristor | $V_{on/off}$ | ±10% V |
| | $K_{on/off}$ | ±10% mm/s |
| | $R_{ON}$ | ±10% Ω |
| | $R_{OFF}$ | |

Noise sources

| | | |
|---|---|---|
| Thermal noise | $2kT\, g^{-1}$, kT/C | $10^{-16} V^2$ s |
| IR drop | $V_w$ | ±10% V |
| Quantization noise | $\frac{V_{FS}}{2^{N+1}} = 56.25$ mV | $\frac{V_{FS}}{2^{N+1}\sqrt{3}} = 32.5$ mV |

Frequency-dependent noise and variations/aging

| | | |
|---|---|---|
| ADC cutoff frequency | $f_{T,max}$ | 1.668 Ghz |
| Propagation time | $R_{OFF} \cdot C_{in}$ | 30 ps |
| Input referred noise | $\log_2\left(\frac{V_{FS}^2}{6kTRf_s}\right)^{0.5} - 1$ | 1.27 mv |
| OpAmp input noise | 1/f flicker noise | 10 nv/√Hz |
| Slew rate | $2\pi fV_{FS}$ | 1.13 V/ns |
| Comparator ambiguity | $\frac{\pi BW}{6.93\, f_s} - 1.1$ | 0.625 mV |
| Jitter | $\log_2\left(\frac{2}{\sqrt{3}\,\pi f_s \tau_{jitter}}\right) - 1$ | 50 ps |
| Memristor stochastics | Poisson process (τ) | $\frac{2.85 \cdot 10^{-5}}{e^{\frac{V_W}{0.156}}} = 1.1\,\mu s$ |
| Memristor OFF impedance | $R_{OFF}$ | $\frac{R_{OFF}}{\sqrt{(1+(R_{OFF}C_{mem}\cdot 2\pi f)^2}}$ |
| Endurance degradation | ΔR | 10%/decade |

Reconfiguration

The basic deterministic functionality of the four-bit ADC is demonstrated during training by the online gradient descent algorithm. The learning rate is crucial to the adaptation performance: it depends on the circuit parameters, the write voltage, the pulse-timewidth, the feedback resistor, the present state, and the physical properties of the memristive device. The learning rate is $$\eta(t) = \frac{\Delta R}{R} = \frac{(R_{OFF} - R_{ON})\Delta s(t)}{R_f}, \quad (11)$$

where Δs is the change in the memristor's internal state, $$\Delta s = \int_0^{T_w} K_{on/off}\left(\frac{V_w}{V_{on/off}} - 1\right)^{\alpha_{on/off}} \cdot f(s)dt, \quad (12)$$

where $K_{on/off}$ and $\alpha_{on/off}$ are constants that describe, respectively, the state evolution rate and its nonlinearity, $V_{on/off}$ are voltage thresholds, and f(s) is a window function that adds nonlinearity and state dependency during state evolution. These parameters are fitted to the Pt/HfO$_x$/Hf/TiN RRAM device. The fitted learning rate may converge to a global minimum with high accuracy. The learning rate is state and time dependent.

Figure 7B:
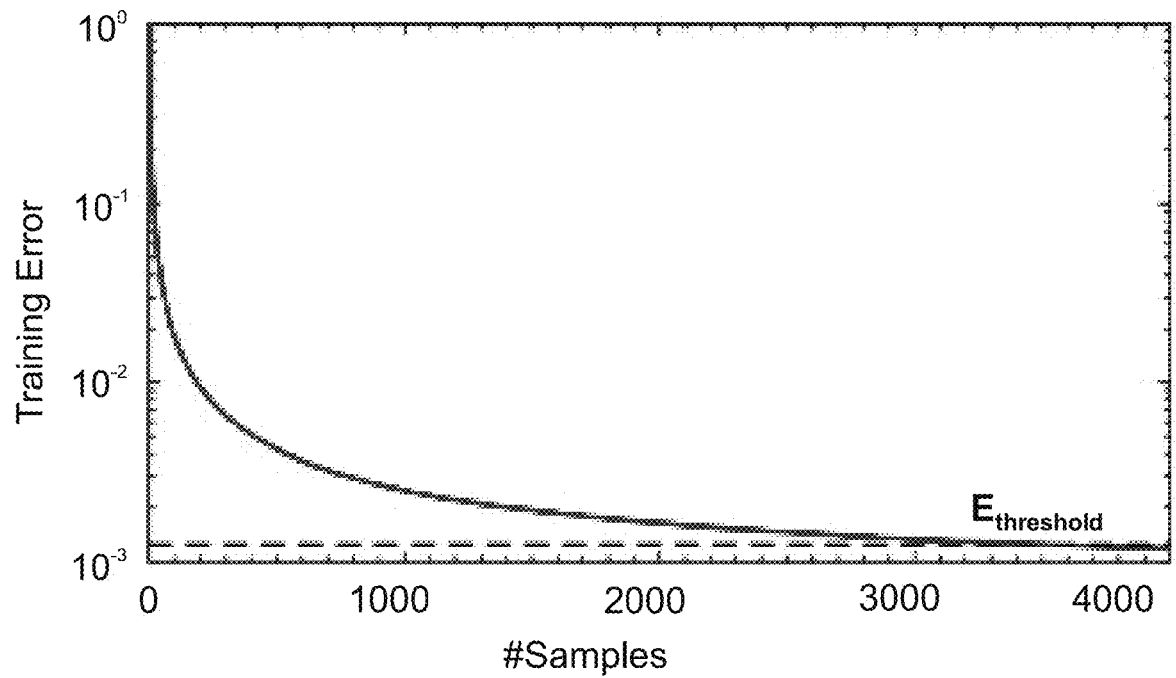
Figure 7C:
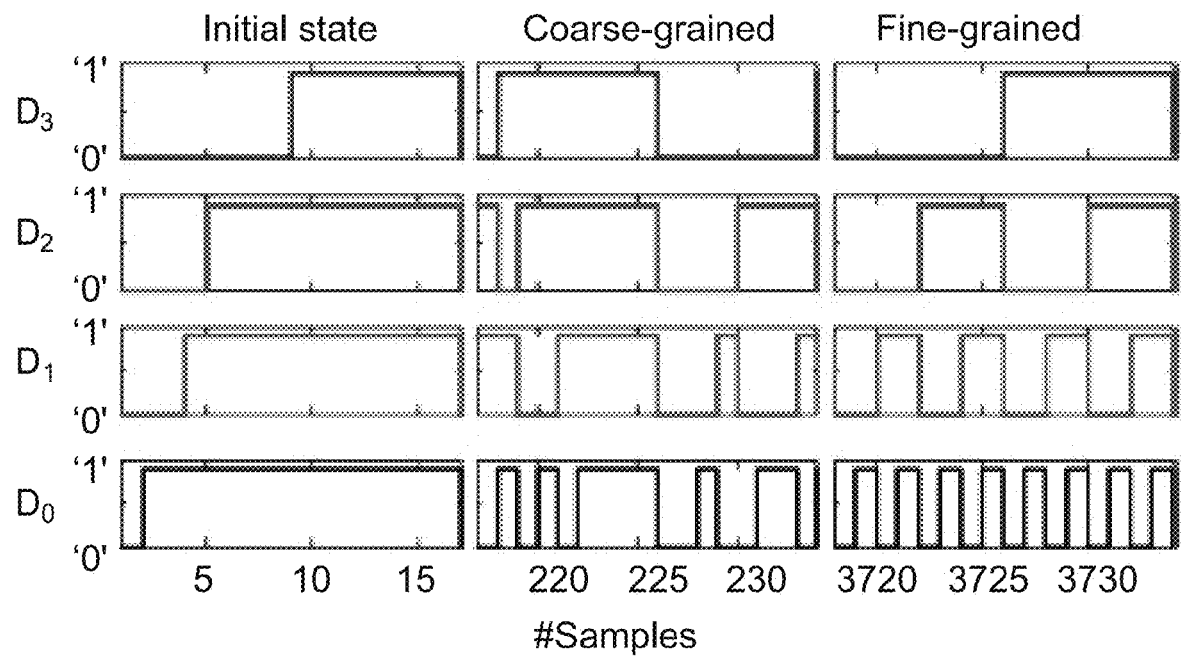
Figure 7D:
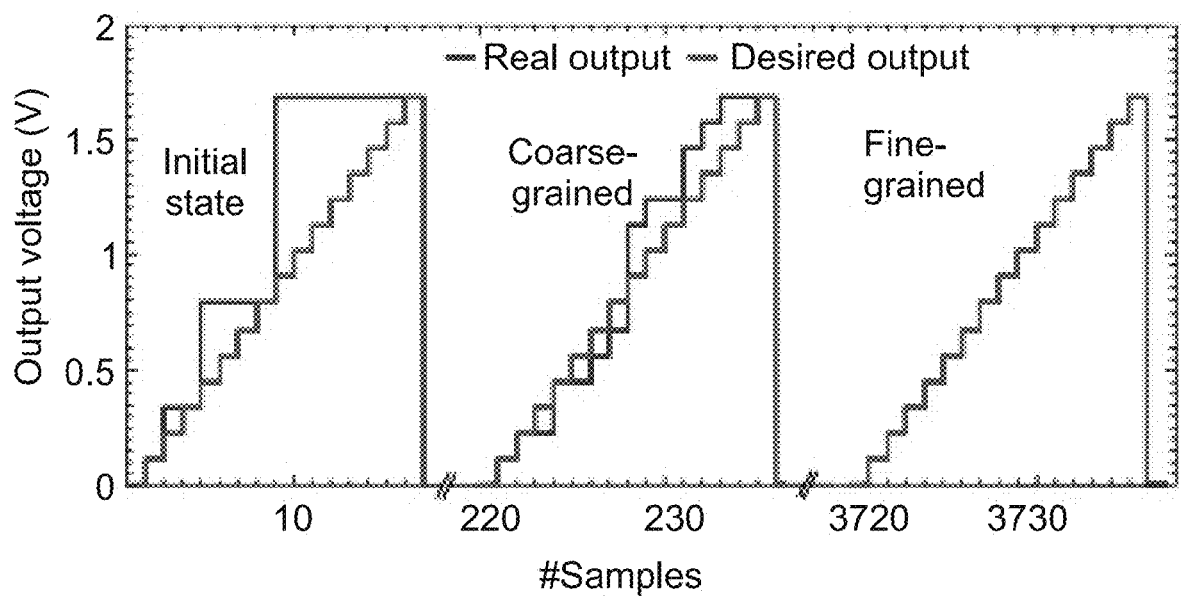

Reference is now made to FIGS. 7a) to 7d) which are four graphs illustrating training evaluation according to the present embodiments. FIG. 7(a) shows synaptic weight reconfiguration during the training phase for the VFS=1.8V and fs=100 KSPS. Synapses are immediately trained for the VFS=0.9V and fs=10 MSPS and shown in real time. The synaptic weight is equal to the ratio between Rf and the corresponding memristor, thus it has no units. FIG. 7(b) shows the LMS error function optimization during training until it achieves Ethreshold. FIG. 7(c) shows the actual digital outputs Di (logical value) at three different time stamps during the training; periodic digital outputs are achieved after the training is finished, corresponding to the analog input ramp. Finally, FIG. 7(d) shows a comparison between the corresponding discrete analog values of the teaching dataset and the actual output by connecting it to an ideal DAC, at three different time stamps during the training, such that an identical staircase is obtained after the training is complete.

More particularly, FIG. 7(a) shows the resistive value of the synapses when two sawtooth training datasets with different full-scale voltage ranges (VDD and VDD/2) and different sampling frequencies ($f_s$ and 100 $f_s$) are applied successively in real time. After approximately 4000 training samples, which is equal to 40 ms training time for 0.1 MSPS conversion rate, the error according may be below $E_{threshold}$ and the network converges from a random initial state to a steady state. $E_{threshold}$ is determined to be 50% effectively misclassified digital output codes (8 codes in the case of 4-bits) out of the total number of training samples, as listed in Table I. Furthermore, when the full-scale voltage changes to $V_{DD}/2$ and the sampling frequency changes to 100 $f_s$, the system converges to a new steady state that quantizes 0.9 V full scale at a 10 MSPS sampling rate. In each case, the network is reconfigured to operate correctly under different specifications, as illustrated by the different synaptic weights in FIG. 7(a). The least mean square error (5) optimization toward its gradient descent during training is shown in FIG. 7(b). In the same context, neural activity adaptation that denotes digital output bits is shown, at three different time stamps, in FIG. 7(c) for the initial state before training (samples 0-15), coarse-grained training (i.e., where the error is slightly higher than $E_{threshold}$, samples 220-235), and fine-grained training (i.e., where the error is sufficiently low and the ADC response converges to the desired state, samples 3720-3735). The digital outputs are ideally converted to discrete analog via an ideal 4-bitDAC that is connected back-to-back and accurately reproduces the ADC's present state, as shown in FIG. 7(d) at the same three time stamps.

Self-Calibration

As explained hereinabove, the accuracy of an ADC depends on many critical factors including process variations, frequency dependent variations, device mismatches, device wear out, parasitic effects, delays, poles, gain and offset errors. Table II lists the magnitude of variability for these effects. The process variation parameters for the memristor are pessimistically chosen, randomly generated with a normal distribution, and incorporated into the VTEAM model with a variance of approximately 10% to cover wide reliability margins. Transistor parameters such as VW, W/L, and VT in Table I are chosen to guarantee a globally optimal solution even under such extreme conditions. In FIGS. 7a)-7d), we show that the training algorithm of the present embodiments can tolerate such variations over time and compensate for them by using different synaptic weights.

Reference is now made to FIGS. 8(*a*) to 8(*d*), which show a static conversion evaluation that shows the efficiency of the training algorithm in mismatch calibration (a) differential and (b) integral non-linearities of the ADC at three different time stamps in response to the DC input voltage ramp. FIG. 8(*c*) is a dynamic conversion evaluation that shows the efficiency of the training algorithm in noise tolerance and distortion mitigation by coherent fast Fourier transform of the ADC output in response to a sinusoidal input signal with 44 kHz frequency at three different time stamps during the training with ENOB calculation, and FIG. 8(*d*) Power evaluation of the network that shows power optimization during training.

More particularly, we statically evaluate how the ADC of the present embodiments responds to the DC ramp signal at the three given time stamps, as illustrated in FIG. 8(*a*) and (*b*). The teaching staircase in FIG. 7(*d*) is a subset of DC ramp input that statically evaluates the ADC at the aforesaid time stamps. The differences between two adjacent digital output decimal codes within the actual ADC output are therefore the differential non-linearities (DNL). Likewise, the differences between the actual ADC output and the ideal staircase for each digital input code are the integral non-linearities (INL). The DNL of the last code is undefined. Results of the maximum DNL and INL are shown, respectively, in FIGS. 8(*a*) and (*b*). Prior to training, the ADC is completely non-linear and non-monotonic, with several missing codes. Thus, INL=8 LSB, and DNL=5 LSB. Improved performance can be seen at the second time stamp (2 ms ~200 samples), where the ADC appears monotonic; however, it is still not accurate (INL=−2 LSB, DNL=2 LSB). After the training is complete (40 ms), the ADC is almost fully calibrated, monotonic, and accurate: INL=0.4 LSB, and DNL=0.5 LSB.

Furthermore, parasitic effects such as capacitance and inductance, as listed in Table II, which are the dominant factors in ADC accuracy at high frequencies, have been adaptively captured as simulated by 10 MSPS within longer training time.

Noise Tolerance

In contemporary ADCs, calibration mechanisms can be used to compensate for device mismatch and process imperfections, but noise can irreparably degrade performance. Noise is also less straightforward to capture at design time. However, we believe that the effects of intrinsic noise on the performance of the analog circuit are relatively small: adaptive intelligent systems that employ machine learning techniques are inherently robust to noise, because noise is a key factor in the type of problems they are designed to solve.

Noise sources include intrinsic thermal noise from the feedback resistor, memristor, and transistor, in addition to quantization noise, jitter, comparator ambiguity, input referred noise, random offsets, non-linear distortions, training label sampling noise, memristor switching stochastics, and frequency-dependent noise. These noise sources are listed in Table II.

The ADC non-linear functionality $V_{out}=f(vi)$ in response to voltage input $vi=A\cos(\omega t)$, where A is the amplitude and $\omega$ is the frequency, could be qualitatively described as:

$$V_{out} = a_0 + a_1 A\cos(wt) + \frac{a_2 A^2}{2}[1 + \cos(2wt)] + \dots, \quad (13)$$

where $\alpha_0$ is the DC constant, $\alpha_1$ is the small-signal gain constant, and $\alpha_2$ is the distortion constant. Thus, as a result of non-linear effects, we get harmonic distortions, which appear as spectral spurs in sampling frequency multiples and degrade the SNDR and the ADC precision. We show that the present algorithm is able to adaptively alleviate non-linear distortions and tolerate noise by estimating the f(•) function.

The ADC is dynamically evaluated and analyzed, at the three given time stamps, in response to a sinusoidal input signal with 44 kHz frequency, which meets the Nyquist condition, $f_{input} \leq fs/2$, and applies for coherent fast Fourier transform (FFT) using a Hamming window and a prime number of cycles distributed over 5000 samples, which is sufficient for reliable FFT without collisions and data loss. FIG. 7(*c*) shows the FFT for signal and distortion power as a function of frequency, where each time stamp is shown in a different color.

The ADC $$V_{out} = a_0 + a_1 A\cos(wt) + \frac{a_2 A^2}{2}[1 + \cos(2wt)] + \dots, \quad (13)$$

cutoff frequency fT, max is bounded by the high-to-low memristor impedance ratio. FIG. 7(*c*) illustrates that the harmonic distortions are mitigated, the fundamental power increases, and the SNDR and ENOB improve as the training progresses.

Synaptic fluctuations arising due to noise and variation sources are mitigated by the switching non-linearity and threshold of the memristor. Nonetheless, the gradient descent algorithm continues capturing and averaging stochastic dynamics and timing uncertainties (jitter) of the sampled input. The comparison to noisy labels may strengthen the immunity of the network against overfitting and achieve reliable generalization performance. In the same context, the memristor switching stochasticity is characterized by a Poisson process, as listed in Table II, and incorporated into the VTEAM model as a probabilistic shift in the threshold. Along with the quantization noise or dither, this helps the network converge to a global minimum, and improve the ENOB, breaking through the thermal noise limit in some cases. This well-known phenomenon is called stochastic resonance. It was reported in the past in ANNs and memristors. Note that smaller learning rates will better overcome real-time variations; however, this will come at the cost of a training time penalty. The effective number of stable resistive levels, as a function of noise margin (NM) due to statistically correlated variation sources, was massively analysed using Monte-Carlo simulations in the above referenced previous work. Furthermore, its impact on the ENOB was determined, with typical results (in 38% of the cases) of 64 resistive levels, ~3% NM, and ~3.7 ENOB.

Power Optimization

As shown above, equivalence is found between the Hopfield like energy function of the network given by (4) and the cost function that solves the conversion optimization given by (6). The cost function achieves its minimum, lower bounded by quantization error power, when the synaptic weights are configured so as to guarantee that each analog input is correctly mapped to its corresponding digital output. In FIG. 6(*b*), we show that the error function given by (8) achieves a global minimum when the network is successfully trained to configure the ADC. Consequently, the power consumption is optimized during training until it achieves its minimal value when the training is finished. The best energetic state of the network according to the present embodiments is achieved when it is configured in an ADC manner. Consequently, the power dissipation of the entire network is analyzed, and is attributed to three sources:

1. Neural integration power: the power dissipated on the feedback resistor of the OpAmp is:

$$P_{int_1} = \left( V_{in} - 2^i V_{ref} - \sum_{j=i+1}^{N-1} \frac{R_f}{R_{ij}} V_j \right)^2 / R_f. \quad (14)$$

This function solves the ADC quantization after training for each neuron, as described in (3). The total neural integration power dissipated on all neurons is $\text{Pint} = \Sigma_{i=0}^{N-1} P_{int_1}$.

2. Neural activation power: the power dissipated on the comparators and OpAmps at the sampling frequency. This power source is constant and negligible: Pacti=3 µW in 0.18 µm CMOS process in fT. The total activation power dissipated on all neurons is $P_{act} = \Sigma_{i=0}^{N-1} P_{act_1}$.

3. Synapse power: the power dissipated on synapses, including reconfigurable and fixed synapses for each neuron, is:

$$P_{synapse_1} = \frac{V_{in}^2}{R_f} + \frac{2^i V_{ref}^2}{R_f} + \sum_{j=i+1}^{N-1} \frac{V_i^2}{R_{ij}}. \quad (15)$$

The total synaptic power dissipation is $\text{Psynapse} = \Sigma_{i=0}^{N-1} P_{synapse_1}$. Note that an effective transistor resistance in series to the memristor is also taken into account. Thus, the total power consumption is the sum of the three power sources averaged on a full-scale ramp with 2N samples (epoch), as shown in FIG. 7(d) during training time. Each point in the horizontal axis represents a full-scale ramp, and its corresponding value in the vertical axis represents the average of the total dissipated power. After the training is finished and the network configured as an ADC, the average of the synapse power on a full-scale ramp is half of the maximum power dissipated, and the neural integration power is minimal. This balance results in optimal power dissipation.

Note that the dynamic power consumption as a result of updating memristors during the training phase is not determined and is not considered as conversion power dissipation by FOM definition in (1). We neglect the power dissipation of the feedback because, after the training is finished, the feedback is disconnected and the network maintains the minimal achieved power dissipation level during conversion. We assume that this power source is relatively low because of the small area of training feedback, short training time, and the small ratio between training to conversion cycles during the lifetime of the converter, even at a high rate of application configurations.

General

In the broader scope of the results shown herein, we discuss the potential to break through the speed-power-accuracy tradeoff. Furthermore, we discuss the scaling issues of the architecture of the present embodiments.

Breaking Through the Speed-Power-Accuracy Tradeoff.

Figure 9B:
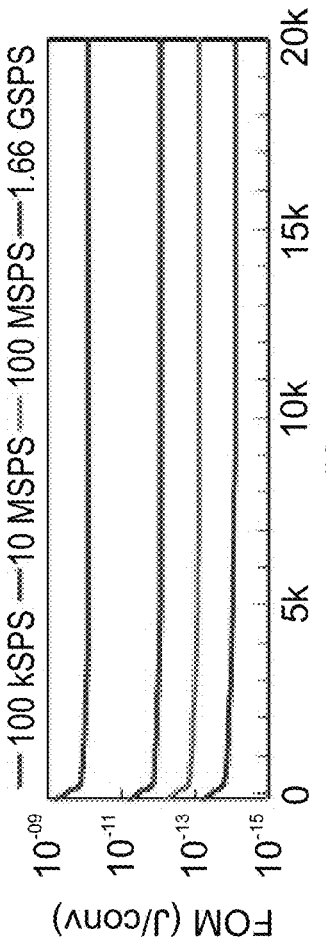
Figure 9C:
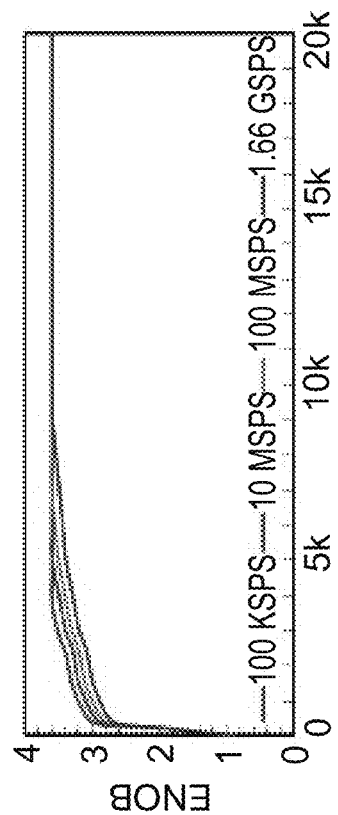
Figure 9D:
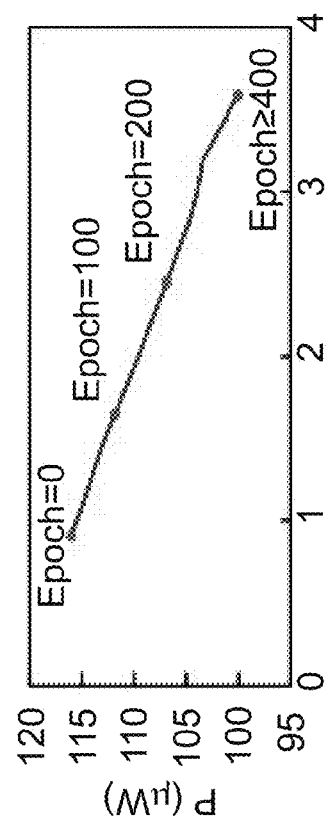

Reference is now made to FIGS. 9a) to 9d) which illustrate breaking through the speed-power-accuracy tradeoff. FIG. 9(a) shows speed-accuracy tradeoff by achieving maximal ENOB regardless of fs after training is complete. FIG. 9b) shows speed-power tradeoff by achieving minimal P regardless of fs after the training is complete. The frequency-dependent power dissipation is negligible. FIG. 9(c) shows accuracy-power tradeoff by achieving maximal ENOB and minimal P after the training is complete. Finally FIG. 9(d) shows FOM dynamic optimization with training. More particularly, having demonstrated the dynamic mechanism of the trainable ADC, we investigate the real-time training of the ADC for general purpose applications. For every selected fs within the fT bandwidth, the ADC is correspondingly trained by a training data-set with the same specifications and achieves optimal ENOB as shown in FIG. 9(a). The maximal ENOB (~3.7) is asymptotically bounded by the intrinsic quantization noise, which is not exceeded. Analogously, the power consumption is dynamically optimized for every fs to achieve the minimal power dissipation of the network, as shown in FIG. 9(b). The power dissipated on resistors has a greater effect on overall power dissipation than the frequency-dependent dissipation (e.g., capacitors). Simultaneously, and as we show that the equivalence between the quantization cost function (6) and the energy function (4) after the error function (8) is optimized, co-optimization in terms of both ENOB and power dissipation along the training samples is achieved, as shown in FIG. 9(c).

Interestingly, the collective optimization of the proposed architecture breaks through the speed-power-accuracy tradeoff, and dynamically scales the FOM to achieve a cutting-edge value of 8.25 fJ/conv·step, as shown in FIG. 9(d) and FIG. 4. The versatility of the proposed architecture with regard to reconfiguration, mismatch self-calibration, noise-tolerance, and power optimization is attained using a simple and minimalistic design with a reconfigurable single-channel. The proposed architecture moreover utilizes the resistive parallel computing of memristors to achieve high speed, in addition to its analog non-volatility, enabling a standard digital ML algorithm to intelligently adjust its conductance precisely and in situ to achieve high-accuracy.

The minimalistic design results in low-power consumption, thus achieving a cost-effective ADC. All these features, when combined with the SAR architecture, the pipelined architecture, and the online trainable mechanism, will enable a general-purpose application architecture.

However, scaling the proposed architecture is challenging. When increasing the scale of the network, the number of neurons, synapses, and feedbacks are quadratically higher. Consequently, this will increase the area and power consumption substantially, as calculated in Table III. Due to the successive nature of the proposed ADC architecture, higher numbers of neurons require longer conversion time as a result of the propagation time, settling time, and decision-making time of each. Therefore, to eliminate signal aliasing, the maximal Nyquist sampling frequency will unfortunately be limited, as determined in Table III.

Additional issues in scaling are the required high-to-low resistance states ratio of the synaptic weights, the number of resistive levels, cutoff frequency, and endurance. We calculate the maximal number of bits in our previous work, which is four bits for the memristive device under test, but devices with higher HRS/LRS are achievable. Moreover, we show herein that device-dependent properties are compensated for by longer training time to achieve maximal ENOB, which is equal to (N−3) bits regardless of the conversion speed.

Overall, the FOM still improves as the number of bits increases, because of the optimal achieved ENOB, as calculated in Table III.

Furthermore, in advanced CMOS technology nodes the FOM may improve due to lower power consumption and higher sampling rates. These findings demonstrate that the proposed architecture is conceptually and practically scalable, even in the presence of the mentioned scaling issues.

The present embodiments may demonstrate a real-time trainable ADC architecture for general purpose applications, which breaks through the speed-power-accuracy tradeoff. Motivated by the analogies between mixed-signal circuits and the neuromorphic paradigm, we exploit the intelligent properties of an ANN, and suggest a pipelined SAR-like neural network architecture ADC that is trained online by a supervised ML algorithm.

The network of the present embodiments shares the Hopfield energy model, and we show the equivalence between the energy function and the conversion cost function and the training error function after the training is complete. The neural network is realized by means of a hybrid CMOS-memristor circuit design. The trainable mechanism successfully proves collective properties of the network in reconfiguration to multiple full-scale voltages and frequencies, mismatch self-calibration, noise-tolerance, stochastic resonance, power optimization, and FOM dynamic scaling. We believe that the ADC of the present embodiments may constitute a milestone with promising results for large-scale architectures of data converters and emerging realtime adaptive applications with varying conditions, such as wearable devices and automotive applications.

It is expected that during the life of a patent maturing from this application many relevant kinds of neural network and ANNs as well as ADC devices and memristors and memristor-like components will be developed and the scopes of the corresponding terms are intended to include all such new technologies a priori.

The terms "comprises", "comprising", "includes", "including", "having" and their conjugates mean "including but not limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

TABLE III

SCALABILITY EVALUATION

| | Area | | | Time | | | | | Memristor | |
| --- | --- | --- | --- | --- | --- | --- | --- | --- | --- | --- |
| # Bits | # Neurons, # feedbacks | # Synapses | Total ($\mu m^2$) | Conversion rate (GSPS) | Training (KSamples) | Wearout (trainings/day for 10 yrs) | Power ($\mu W$) | FOM (fJ/conv) | HRS LRS | # levels |
| 4 | 4 | 10 | 4850 | 1.66 | 4 | 150 | 100 | 8.25 | $2^4$ | 64 |
| 8 | 8 | 36 | 9740 | 0.74 | 6 | 100 | 650 | 7.5 | $2^8$ | 2048 |
| N | N | $\frac{N(N+1)}{2}$ | $\approx N(1.1N + 1208)$ | $\frac{1}{N \cdot t_p + \frac{N-1}{BW}}$ | $\left(2 - 2^{1-\frac{N}{4}}\right) \cdot 4$ | $\frac{150}{2 - 2^{1-\frac{N}{4}}}$ | $P_{int} + P_{act} + P_{synapse}$ | $\frac{P}{2^{N-0.3} f_s}$ | $2^{N-1+\log_2 \frac{V_{DD}}{V_{FS}}}$ | $N \cdot 2^N$ |

What is claimed is:

1. An analog to digital converter comprising:
an input for receiving an analog input signal;
a plurality of outputs for outputting parallel bits of a digital signal that represents said analog input signal; and
a trainable neural network layer, the neural network layer comprising connections between each of said outputs respectively, each connection having a weighting, the weighting being adjustable for training, wherein said connections comprise adaptable synapses respectively to provide said adjustable weightings, and wherein each adaptable synapse is set with a respective weighting and each output bit is a comparison result from a weighted sum of said plurality of output bits.

2. The device of claim 1, wherein each of said adaptable synapses comprises a memristor, said memristor being set with said respective weight.

3. The device of claim 2, further comprising a training unit, said training unit having a training dataset input and being connected to said plurality of output bits and being configured to adjust each of said adaptable synapses until outputs of a given input correspond to a training dataset.

4. The device of claim 3, wherein said training dataset is used in combination with a predetermined maximum voltage and a predetermined number of output bits.

5. The device of claim 3, configured to carry out said adjusting by using online gradient descent.

6. The device of claim 5, wherein said online gradient descent comprises iterations k of $$W^{(k+1)} = W^{(k)} - \frac{\eta}{2} \nabla_{W^{(k)}} \sum_{i=0}^{N-1} \left(D_i^{(k)} - T_i^{(k)}\right)^2$$

wherein $\eta$ is a learning rate and $Vi^{(k)}$ is a single empirical sample provided to the input at the $k^{th}$ iteration, and:

$$\Delta W_{ij(j>i)}^{(k)} = -\eta (T_i^{(k)} - D_i^{(k)}) T_j^{(k)}.$$

7. The device of claim 3, wherein said adjusting comprises minimizing a training error function and an energy cost function.

8. The device of claim 3, wherein said adjusting comprises minimizing a figure of merit, said figure of merit being:

$$\frac{P}{2^{ENOB} \cdot f_s} \left[\frac{J}{conv}\right]$$

wherein P is a power dissipation during conversion, fs is a sampling frequency and:

$$ENOB = \frac{SNDR(\text{dB}) - 1.76}{6.02}$$

wherein SNDR is a signal and noise to distortion ratio.

9. An analog to digital conversion method comprising:
receiving an analog input signal;
outputting parallel bits of a digital signal that represents said analog input signal at outputs;
providing connections between each of said outputs respectively; and
providing an adjustable weighting to each connection, thereby to provide a trainable neural network connecting said outputs, wherein said connections form a neural network and said providing an adjustable weighting comprises adapting a synapse of said neural network, the method further comprising setting each adaptable synapse weighting respectively such that each output bit is a comparison result from a weighted sum of said plurality of output bits.

10. The method of claim 9, wherein each of said adaptable synapses comprises a memristor, said memristor being set with said respective weight.

11. The method of claim 9, comprising using training to set said respective weights, said training comprising adjusting each of said adaptable synapses until outputs of a given input correspond to a training dataset.

12. The method of claim 11, wherein said training dataset is used in combination with a predetermined maximum voltage and a predetermined number of output bits.

13. The method of claim 12, comprising carrying out said adjusting by using online gradient descent.

14. The method of claim 13, wherein said online gradient descent comprises iterations k of $$W^{(k+1)} = W^{(k)} - \frac{\eta}{2} \nabla_{W^{(k)}} \sum_{i=0}^{N-1} \left(D_i^{(k)} - T_i^{(k)}\right)^2$$

wherein $\eta$ is a learning rate and $Vi^{(k)}$ is a single empirical sample provided to the input at the $k^{th}$ iteration, and:

$$\Delta W_{ij(j>i)}^{(k)} = -\eta (T_i^{(k)} - D_i^{(k)}) T_j^{(k)}.$$

15. The method of claim 11, wherein said adjusting comprises minimizing a training error function and an energy cost function.

16. The method of claim 11, wherein said adjusting comprises minimizing a figure of merit, said figure of merit being:

$$\frac{P}{2^{ENOB} \cdot f_s} \left[\frac{J}{conv}\right]$$

wherein P is a power dissipation during conversion, fs is a sampling frequency, $$ENOB = \frac{SNDR(\text{dB}) - 1.76}{6.02}$$

and SNDR is a signal and noise to distortion ratio.

* * * * *